(12) United States Patent
Tang et al.

(10) Patent No.: US 12,388,692 B2
(45) Date of Patent: Aug. 12, 2025

(54) HYBRID CLOCKING SCHEME FOR SERDES PHYSICAL LAYER CIRCUITS

(71) Applicant: QUALCOMM Incorporated, San Diego, CA (US)

(72) Inventors: Chiu Keung Tang, San Diego, CA (US); Zhiqin Chen, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 81 days.

(21) Appl. No.: 18/505,477

(22) Filed: Nov. 9, 2023

(65) Prior Publication Data

US 2025/0158858 A1    May 15, 2025

(51) Int. Cl.
*H04L 27/227* (2006.01)
*H03L 7/18* (2006.01)
*H04L 27/38* (2006.01)

(52) U.S. Cl.
CPC ............ *H04L 27/2272* (2013.01); *H03L 7/18* (2013.01); *H04L 27/2273* (2013.01); *H04L 27/3854* (2013.01)

(58) Field of Classification Search
CPC .............. H04L 27/2272; H04L 27/2273; H04L 27/3854; H04L 27/18; H03L 7/18; G06F 1/08; G06F 1/06; G06F 1/04; H03B 27/00; H03B 2200/0078; H03B 2200/008; H03D 3/007; H03D 7/165
See application file for complete search history.

(56) References Cited

U.S. PATENT DOCUMENTS

| 6,069,511 A | 5/2000 | Mohan |
| 6,198,322 B1 | 3/2001 | Yoshimura |
| 6,377,095 B1 | 4/2002 | Kuo |

(Continued)

FOREIGN PATENT DOCUMENTS

| CN | 112152597 A | 12/2020 |
| JP | 2010157923 A | 7/2010 |

(Continued)

OTHER PUBLICATIONS

International Search Report and Written Opinion—PCT/US2022/070650—ISA/EPO—Jun. 8, 2022.

(Continued)

*Primary Examiner* — Jung Kim
(74) *Attorney, Agent, or Firm* — Loza & Loza, LLP

(57) ABSTRACT

A method for generating clock signals includes dividing an input clock signal to obtain a first in-phase output clock signal, dividing an inverted version of the input clock signal to obtain a first quadrature output clock signal, delaying edges in the input clock signal to obtain a second quadrature output clock signal, selecting a full-rate output to provide a multiphase output clock in a first mode of operation, and selecting a half-rate output to provide the multiphase output clock in a second mode of operation. The first quadrature output clock signal is a quadrature version of the first in-phase output clock signal. The first in-phase output clock signal and the first quadrature output clock signal are included in the full-rate output. The second quadrature output clock signal is included in the half-rate output and is a quadrature version of the input clock signal.

27 Claims, 14 Drawing Sheets

(56) References Cited

U.S. PATENT DOCUMENTS

| | | |
|---|---|---|
| 6,861,877 B2 | 3/2005 | Shiah |
| 7,705,649 B1 | 4/2010 | Yu et al. |
| 8,228,126 B2 | 7/2012 | Liang et al. |
| 11,329,639 B1 | 5/2022 | Tang |
| 2003/0214338 A1 | 11/2003 | Silvestri |
| 2006/0214688 A1 | 9/2006 | Pan et al. |
| 2007/0030754 A1* | 2/2007 | Gomm .................. H03L 7/0818 365/233.13 |
| 2008/0036517 A1 | 2/2008 | Huang et al. |
| 2011/0291726 A1 | 12/2011 | Kim et al. |
| 2012/0306554 A1 | 12/2012 | Ma et al. |
| 2013/0106377 A1 | 5/2013 | Lee et al. |
| 2015/0341021 A1 | 11/2015 | Ma |

FOREIGN PATENT DOCUMENTS

| | | |
|---|---|---|
| JP | 2011114858 A | 6/2011 |
| JP | 2013243436 A | 12/2013 |
| KR | 20090114989 A | 11/2009 |
| KR | 20100052079 A | 5/2010 |
| KR | 20120027850 A | 3/2012 |
| WO | 2008047682 A1 | 4/2008 |

OTHER PUBLICATIONS

Salem K., et al., "A Reference Frequency Quadrupler for High Performance Frequency Synthesizers", Microelectronics Journal, Mackintosh Publications Ltd. Luton, GB, vol. 101, May 8, 2020 (May 8, 2020), 7 Pages, XP086172623, ISSN: 0026-2692, DOI: 10.1016/J.MEJO.2020.104813 [retrieved on May 8, 2020], p. 3, figures 2-3.

International Search Report and Written Opinion—PCT/US2024/050731—ISA/EPO—Feb. 26, 2025.

Kehrer D., et al., "A 30-Gb/s 70-mW One-Stage 4:1 Multiplexer in 0.13-μM CMOS", IEEE Journal of Solid-state Circuits, IEEE, USA, vol. 39, No. 7, Jul. 1, 2004, pp. 1140-1147, XP001224116, figure 8.

* cited by examiner

HYBRID CLOCKING SCHEME FOR SERDES PHYSICAL LAYER CIRCUITS

TECHNICAL FIELD

The present disclosure generally relates to a clock and data recovery circuits and, more particularly, to circuitry for generating multiple clock signals at different phases.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a communication link. In high-speed applications, timing of the operation of a SERDES may be controlled by multiple clock signals. The use of multiple increased frequency clock signals results in increased power consumption. Furthermore, the SERDES generally operates using clock signals that have the same frequency but different phases. Performance, accuracy or reliability of the SERDES may depend on frequency and the phase relationships of the clock signals and drift or other variations in the phase relationships of clock signals can result in errors in received data. Therefore, there is an ongoing need for new techniques that provide reliable lower-power clock generation and calibration circuits for components used to receive clock signals over high-speed serial links.

SUMMARY

Certain aspects of the disclosure relate to IC devices that include a bus interface. The bus interface may include a hybrid clock generation circuit that can be configured to produce multi-phase clock signals for controlling transmissions over a communication bus or sampling and/or capturing data from signals transmitted over the communication bus.

In various aspects of the disclosure, the hybrid clock generation circuit has a divider circuit that includes a first divider coupled to an input clock signal and configured to provide a first in-phase output clock signal in a full-rate output, the first in-phase output clock signal having a frequency that is half the frequency of the input clock signal, and a second divider coupled to an inverted version of the input clock signal and configured to provide a first quadrature output clock signal in the full-rate output, the first quadrature output clock signal being a quadrature version of the first in-phase output clock signal. The hybrid clock generation circuit also has a delay cell configured to delay edges in the input clock signal and to provide a half-rate output that includes a second quadrature output clock signal that is a quadrature version of the input clock signal. The hybrid clock generation circuit also has a multiplexer configured to select the full-rate output to provide a multiphase output clock when the hybrid clock generation circuit is configured for a first mode of operation, and to select the half-rate output to provide the multiphase output clock when the hybrid clock generation circuit is configured for a second mode of operation. The multiphase output clock may correspond to the multi-phase clock signals used for controlling transmissions over the communication bus or sampling and/or capturing data from the signals transmitted over the communication bus.

In various aspects of the disclosure, a method for generating clock signals includes dividing an input clock signal to obtain a first in-phase output clock signal, dividing an inverted version of the input clock signal to obtain a first quadrature output clock signal, delaying edges in the input clock signal to obtain a second quadrature output clock signal, selecting a full-rate output to provide a multiphase output clock in a first mode of operation, and selecting a half-rate output to provide the multiphase output clock in a second mode of operation. The first quadrature output clock signal is a quadrature version of the first in-phase output clock signal. The first in-phase output clock signal and the first quadrature output clock signal are included in the full-rate output. The second quadrature output clock signal is a quadrature version of the input clock signal. The second quadrature output clock signal is included in the half-rate output. In some implementations, the method may be at least partially performed using the hybrid clock generation circuit.

In various aspects of the disclosure, an apparatus provides means for dividing an input clock signal, including a first divider that is configured to provide a first in-phase output clock signal in a full-rate output, and a second divider that is configured to provide a first quadrature output clock signal in the full-rate output. The first in-phase output clock signal has a frequency that is half the frequency of the input clock signal. The first quadrature output clock signal is a quadrature version of the first in-phase output clock signal. The apparatus further provides means for delaying edges in the input clock signal, including a delay cell that is configured to provide a second quadrature output clock signal in a half-rate output. The second quadrature output clock signal is a quadrature version of the input clock signal. The apparatus further provides means for selecting a multiphase output clock, including a multiplexer that is configured to select the full-rate output to provide the multiphase output clock in a first mode of operation, and select the half-rate output to provide the multiphase output clock in a second mode of operation. In some implementations, the apparatus is configured to operate as a hybrid clock generation circuit.

In certain aspects, the first divider is further configured to provide an inverted version of the first in-phase output clock signal in the full-rate output. The second divider may be further configured to provide an inverted version of the first quadrature output clock signal in the full-rate output.

In certain aspects, the delay cell is configured to provide a second in-phase output clock signal in the half-rate output. The second in-phase output clock signal may be an in-phase version of the input clock signal. The delay cell may be configured to provide an inverted version of the second in-phase output clock signal in the half-rate output. The delay cell may include a compensation section. In the compensation section, a first tracking circuit may be configured to provide cross-skew compensation to rising edges in the second in-phase output clock signal, and a second tracking circuit may be configured to provide cross-skew compensation to falling edges in the second in-phase output clock signal.

In certain aspects, the delay cell is configured to provide an inverted version of the second quadrature output clock signal in the half-rate output. The delay cell may be configured to receive the input clock signal through a first duty cycle correction circuit. The first duty cycle correction circuit may be configured to decouple the delay cell from the input clock signal when the hybrid clock generation circuit is configured for the first mode of operation. The delay cell may have a second duty cycle correction circuit configured to correct duty cycle distortions caused by the delay cell.

In certain aspects, the first divider and the second divider may be configured to receive the input clock signal through a third duty cycle correction circuit. The third duty cycle correction circuit may be configured to decouple the first divider and the second divider from the input clock signal when the hybrid clock generation circuit is configured for the second mode of operation.

DETAILED DESCRIPTION

Figure 1:
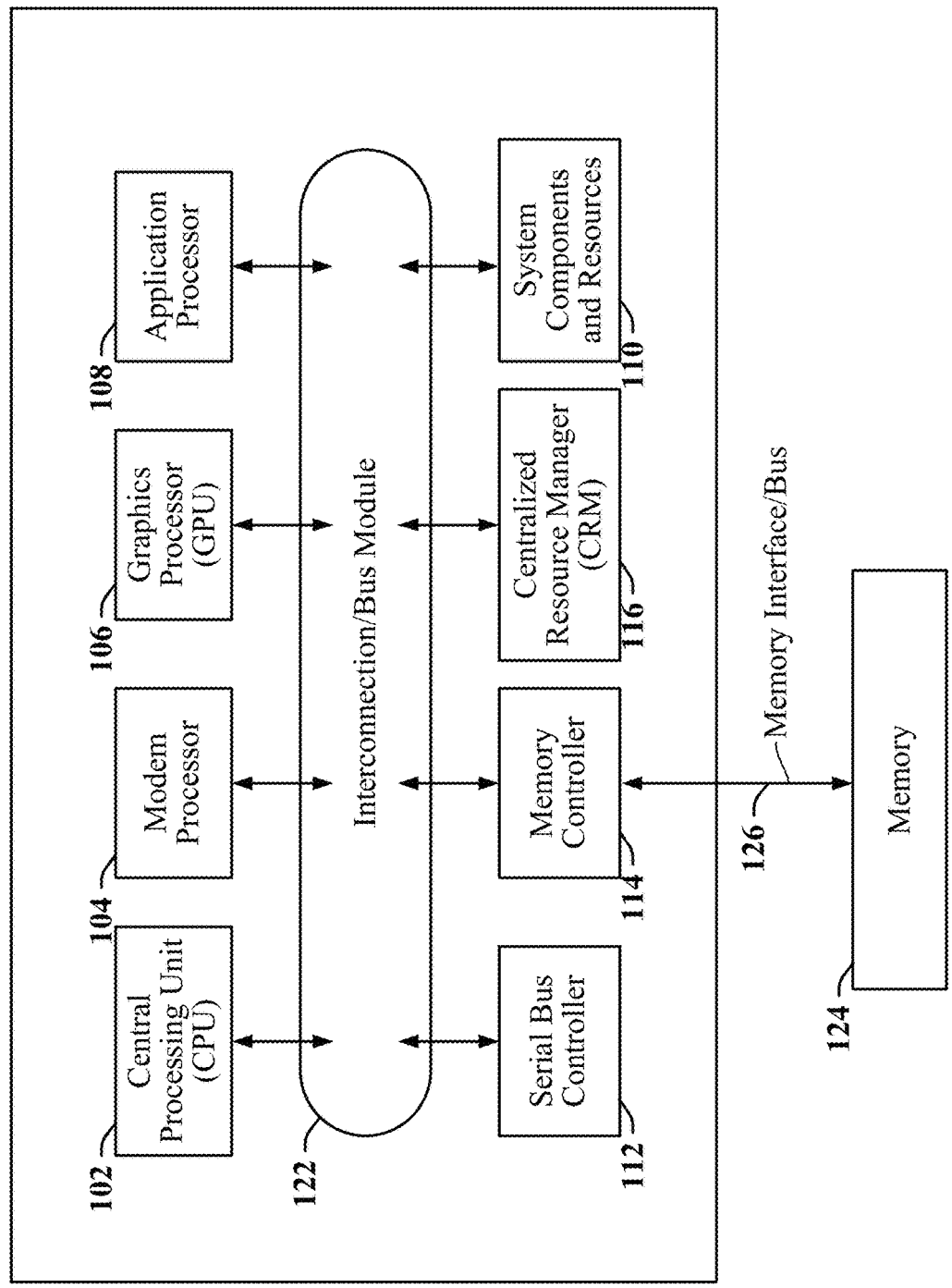
FIG. 1 illustrates an example of a system-on-a-chip (SoC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of the invention will now be presented with reference to various apparatus and methods. These apparatus and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

Data communication links employed by SoCs and other IC devices to connect processors with modems and other peripherals may be operated in accordance with industry or proprietary standards or protocols associated with certain functions or types of devices. According to certain aspects of the disclosure, a serial data link may be used to interconnect electronic devices that are subcomponents of an apparatus such as a cellular phone, a smart phone, a session initiation protocol (SIP) phone, a laptop, a notebook, a netbook, a smartbook, a personal digital assistant (PDA), a satellite radio, a global positioning system (GPS) device, a smart home device, intelligent lighting, a multimedia device, a video device, a digital audio player (e.g., MP3 player), a camera, a game console, an entertainment device, a vehicle component, a wearable computing device (e.g., a smart watch, a health or fitness tracker, eyewear, etc.), an appliance, a sensor, a security device, a vending machine, a smart meter, a drone, a multicopter, or any other similar functioning device.

Certain aspects of the disclosure are applicable to input/out (I/O) circuits that provide an interface between core circuits and memory devices. Many mobile devices employ Synchronous Dynamic Random Access Memory (SDRAM), including Low-Power Double Data Rate SDRAM, which may be referred to as low-power DDR SDRAM, LPDDR SDRAM or, in some instances, LPDDRx where x describes the technology generation of the LPDDR SDRAM. Later generations of LPDDR SDRAM designed to operate at higher operating frequencies may employ lower voltage levels in the core of an SoC or memory device to mitigate for increased power associated with the higher operating frequencies.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain examples of circuits, including direct-feedback circuits, are illustrated herein as being implemented using P-type metal-oxide-semiconductor (PMOS) transistors, N-type metal-oxide-semiconductor (NMOS) transistors or some combination of NMOS and PMOS transistors. These circuits are provided by way of example only, and it is contemplated that the concepts disclosed herein can be implemented in circuits that use various other combinations of NMOS and PMOS transistors.

FIG. 1 illustrates an example of an apparatus 100 in which certain components and interconnections are implemented in an SoC. The SoC may include or be coupled to a memory interface/bus 126 that can be adapted according to certain aspects of the present disclosure. The apparatus 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The apparatus 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The apparatus 100 may further include a Universal Serial Bus controller (the USB controller 112) or other serial bus controller, one or more memory controllers 114, and a centralized resource manager (CRM) 116. The apparatus 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via the memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the apparatus 100.

Figure 2:
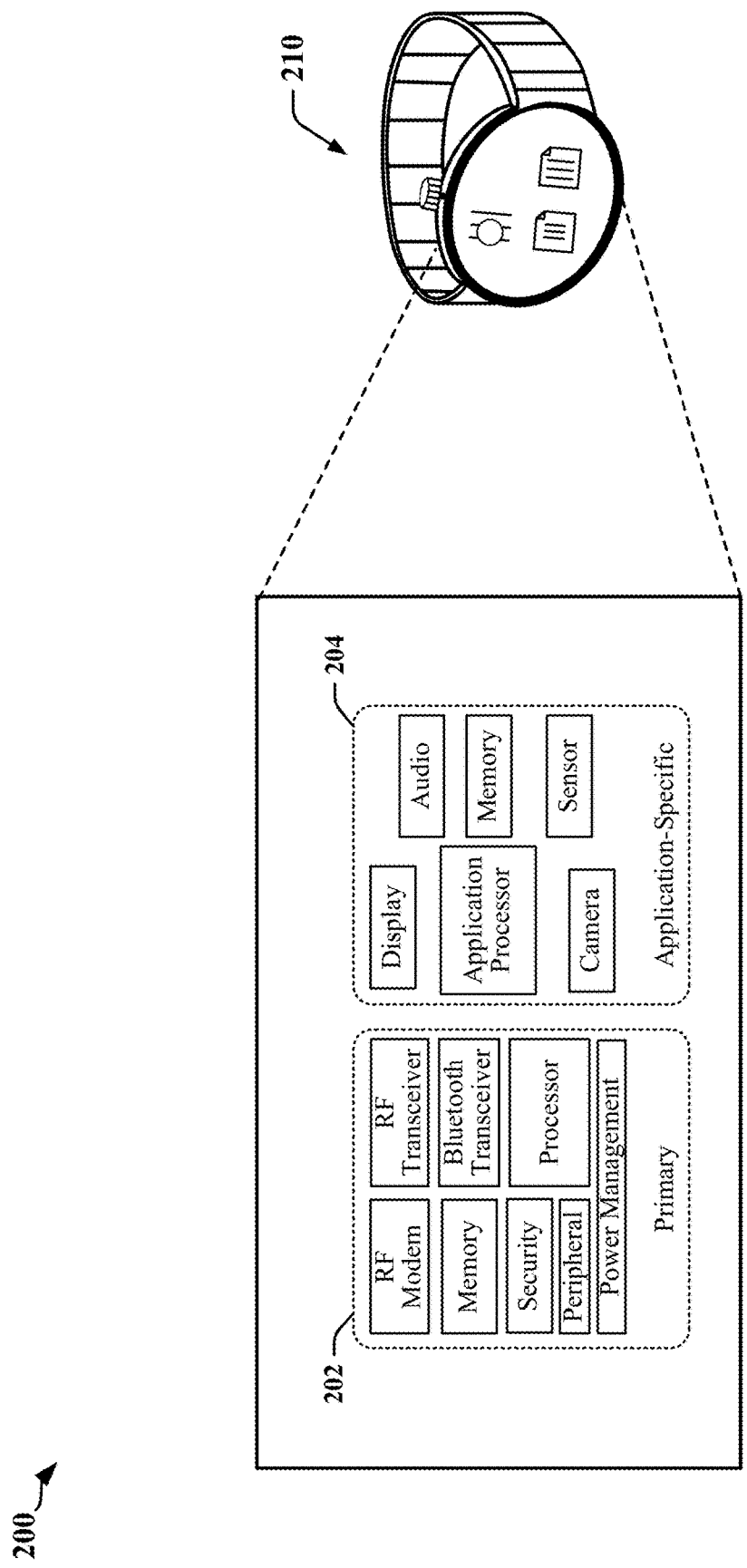
FIG. 2 illustrates an apparatus employing interconnected chiplets.

FIG. 2 illustrates an example of an apparatus 200 in which certain components are implemented using multiple chiplets that are interconnected using one or more data communication buses. In one example, the apparatus 200 may be enclosed within a wearable device a portable or wearable processing and/or communication device (each of which being referred to herein as a portable communication device or PCD), sensors, instruments, appliances and other such devices include one or more ICs. These devices may include mobile phones, tablet computers, palmtop computers, portable digital assistants (PDAs), portable game consoles, and other portable electronic devices such as the illustrated smartwatch 210. PCDs commonly contain integrated circuits or SoCs that include numerous components or subsystems designed to work together to deliver functionality to a user. The various SoC subsystems may communicate with each other via one or more intra-chip data buses or similar data communication interconnects. PCDs may have multiple SoCs that communicate with each other via similar inter-chip interconnects. The ICs are typically packaged in an IC package, which may be referred to as a "semiconductor package" or "chip package." The IC package typically includes a package substrate and one or more IC chips or other electronic modules mounted to the package substrate to provide electrical connectivity to the IC chips. For example, an IC chip in an IC package may be configured as an SoC. The IC chips are electrically coupled to other IC chips and/or to other components in the IC package through electrical coupling to metal lines in the package substrate. The IC chips can also be electrically coupled to other circuits outside the IC package through electrical connections of external metal interconnects (e.g., solder bumps) of the IC package.

Chiplet technology can be used to address some of the performance, power and size design requirements for complex SoCs used in certain mobile or wearable devices. The block diagram in FIG. 2 illustrates certain aspects of an apparatus 200 that can be constructed using chiplets. The apparatus 200 may be configured by selecting a combination of chiplets that implement certain subsystems or distinct functional elements. In the illustrated example, the apparatus 200 includes a set of primary chiplets 202 that enable the apparatus 200 to perform core processing, security and communication functions. The set of primary chiplets 202 include a processor, memory and one or more modems. The illustrated apparatus 200 also includes a set of application-specific chiplets 204 that includes an application processor, display driver, camera interface and audio controller. In a remote sensing device or appliance, the audio-visual components could be omitted and may be replaced with analog-to-digital controllers, for example.

The apparatus 200 may include a variety of processing engines, such as central processing units (CPUs) with multiple cores, graphical processing units (GPUs), digital signal processors (DSPs), neural processing units (NPUs), wireless transceiver units (also referred to as modems), peripherals, display and imaging interfaces, etc. Each of these subsystems and other functional elements can be implemented as an individual chiplet, or as a combination of chiplets. The chiplets included in the apparatus 200 can be proprietary or may be acquired from a variety of sources. An SoC may be constructed from chiplets manufactured at different process nodes and/or operated at different voltages.

Figure 3:
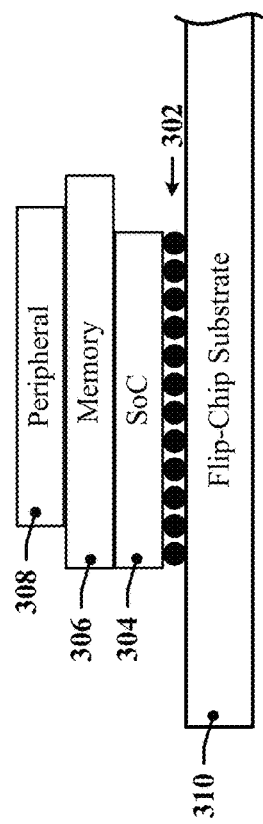
FIG. 3 illustrates an example of an apparatus in which chiplets are stacked vertically on a substrate.

FIG. 3 illustrates an example of an SoC 300 in which certain chiplets 304, 306, 308 are stacked vertically on a substrate 310. Some chiplets can be included in stacks that are deployed across the surface of the substrate 310, while other chiplets may be individually mounted on the surface of the substrate. Chiplets may be mounted on the surface of the substrate using solder balls 302 that provide electrical and/or thermal coupling between substrate and the mounted chiplets. An interconnect structure may be formed that enables chiplets 304, 306, 308 in a stack of chiplets to communicate with one another, with other chiplets mounted on the substrate 310 and with input/output structures that connect the apparatus 200 with other circuits, displays, imaging sensors and other peripherals with an apparatus.

The use of chiplets can reduce the areal size of the substrate 310 and increase three-dimensional packing density. The constituent chiplets may provide complex features and high performance within a smaller form-factor operated at lower power specifications. Moreover, each chiplet may define multiple power domains, operate at different frequencies and different chiplets may manage power/frequency modes independently and. In some instances, two or more chiplets may be operated in mutually exclusive power states. Additionally, operating conditions for an SoC depend on the type, number and arrangement of chiplets included on the substrate in addition to the modes of operation defined by applications. It is necessary to consider power usage by all chiplets in the SoC in order to ensure compliance with power budgets assigned for an application or device. Conventional chiplet-based implementations suffer from limitations that include complex or difficult interconnect routing, local hotspots arising from routing congestion caused by connection architecture and challenges to signal timing specifications. In certain examples, local hotspots can arise from routing congestion, increased feature complexity and circuit concentrations. In certain examples, signal timing specifications can be compromised due to the necessity for an increased number of isolation clamps due to logic placement, number of voltage domains and reduced floorplan. Long wire crossings between chiplets can cause routing congestion.

Each chiplet in an SoC may be included to perform a specific function or type of function and the configuration of the chiplets can introduce further complexities and challenges for designers. For example, one chiplet may include radio frequency front end circuits that produce high frequency signals ranging up to 5 GHz or more, and may further include interfaces that are used by low-frequency power management circuits. A designer may import previously defined circuit blocks to implement some of the internal functions. These circuit blocks may be referred to as macros. Imported circuit blocks for a given process technology may be described, characterized or defined by a set of masks, hardware description language, specifications and test data. Commercially available or proprietary circuit blocks may be referred to as hard macros. Hard macros are tested and verified for a set of design and operating specifications. It is common for hard macros and other circuit blocks to define multiple power domains.

Figure 4:
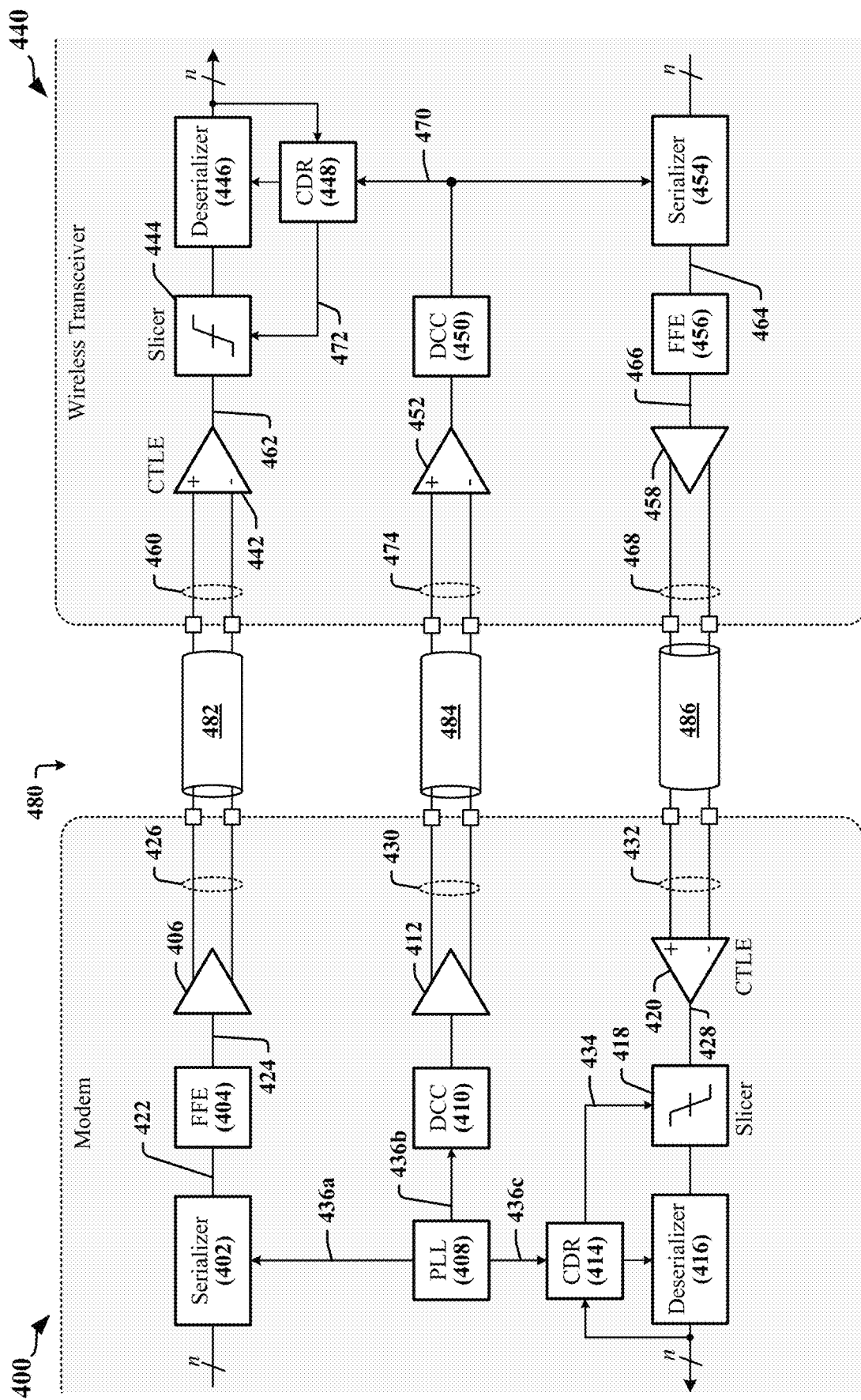
FIG. 4 illustrates an example of a system that employs a multi-channel data communication link.

FIG. 4 illustrates an example of a system that employs a multi-channel data communication link 480 to couple a modem 400 with a wireless transceiver 440. The data communication link 480 includes data channels 482 and 486 and a clock channel 484 that provide a transmission medium through which signals propagate between devices. In the illustrated example, a modem 400 transmits data in a first signal over a first data channel 482 to a wireless transceiver 440 and receives data in a second signal transmitted over a second data channel 486. Data signals are transmitted over the data channels 482 and 486 in accordance with timing information provided by a bus clock signal 430 transmitted over the clock channel 484.

The modem 400 may include a serializer 402 configured to convert n-bit parallel data elements, bytes or words into a serial data stream for transmission in a transmit data signal 422 over the first data channel 482. The transmit data signal 422 may be preconditioned by a pre-equalizing circuit, such as the illustrated digital feed-forward equalizer (the FFE 404), in order to combat or compensate for signal distortions attributable to inter-symbol interference (ISI), reflection and other effects that can be expected to limit bandwidth in first data channel 482. The preconditioned transmit data signal 424 output by the FFE 404 is provided to a driver circuit 406 that is configured to drive the first data channel 482.

The modem 400 may include a serializer 402 configured to convert n-bit parallel data elements, bytes or words into a serial data stream for transmission in a serialized data signal 422. The serialized data signal 422 may be preconditioned by a pre-equalizing circuit, such as the illustrated digital feed-forward equalizer (the FFE 404), in order to combat or compensate for signal distortions attributable to inter-symbol interference (ISI), reflection and other effects that can be expected to limit bandwidth in the first data channel 482. A preconditioned data signal 424 output by the FFE 404 is provided to a driver circuit 406 that is generate configured to generate and transmit a differential transmit data signal 426 over the first data channel 482.

The wireless transceiver 440 can be configured to process a data signal 460 received over the first data channel 482. The data signal 460 may be provided to a differential receiver 442, which may include or cooperate with an equalizing circuit. In one example, continuous time linear equalization (CTLE) may be used to compensate for certain losses experienced in the first data channel 482. The first data channel 482 may be characterized in some respects as a low-pass filter. In the illustrated example, the differential receiver 442 outputs an equalized data signal 462 that is sampled by a slicer 444. The slicer 444 may be implemented using a D-flipflop or the like and may be configured to capture signaling state of the equalized data signal 462 under the control of edges in a sampling clock signal 472 generated by a clock and data recovery (CDR) circuit 448. The output of the slicer 444 may be provided to a deserializer 446 that is clocked in accordance with one or more clock signals provided by the CDR circuit 448. The CDR circuit 448 may be configured to delay or phase shift a receiver clock signal 470 to ensure that edges in the sampling clock signal 472 are timed to optimize sampling reliability.

In the illustrated wireless transceiver 440, the receiver clock signal 470 is derived from a received bus clock signal 474 from the clock channel 484. A differential receiver 452 coupled to the clock channel 484 may be configured to equalize the received bus clock signal 474, and a duty cycle correction circuit 450 may be used to adjust the duty cycle of the receiver clock signal 470. The receiver clock signal 470 is provided to a serializer 454 that is configured to convert n-bit parallel data elements, bytes or words into a serial data stream for transmission in a serialized data signal 464. The serialized data signal 464 may be preconditioned by a pre-equalizing circuit, such as the illustrated FFE 456, in order to combat or compensate for signal distortions attributable to ISI, reflection and other effects that can be expected to limit bandwidth in the second data channel 486. A preconditioned data signal 466 output by the FFE 456 is provided to a driver circuit 458 that is configured generate and transmit a differential transmit data signal 468 over the second data channel 486.

The illustrated modem 400 can be configured to process a data signal 432 received over the second data channel 486. The data signal 432 may be provided to a differential receiver 420, which may include or cooperate with an equalizing circuit. In one example, CTLE may be used to compensate for certain losses experienced in the second data channel 486. The second data channel 486 may be characterized in some respects as a low-pass filter. In the illustrated example, the differential receiver 420 outputs an equalized data signal 428 that is sampled by a slicer 418. The slicer 418 may be implemented using a D-flipflop or the like and may be configured to capture signaling state of the equalized data signal 428 under the control of edges in a sampling clock signal 434 generated by a CDR circuit 414. The output of the slicer 418 may be provided to a deserializer 416 that is clocked in accordance with one or more clock signals provided by the CDR circuit 414. The CDR circuit 414 may be configured to delay or phase shift a transmitter clock signal to ensure that edges in the sampling clock signal 434 are timed to optimize sampling reliability.

A clock generation circuit, including the illustrated phase locked loop 408, may generate multiple clock signals 436a, 436b, 436c used by the modem 400. One or more of the clock signals 436a, 436b, 436c may be a divided version of a base clock signal generated by the PLL 408. One or more of the clock signals 436a, 436b, 436c may be phase shifted with respect to the base clock signal. In one example, the serializer 402 may produce the serialized data signal 422 using timing provided by a first clock signal 436a. In another example, the bus clock signal 430 transmitted over the clock channel 484 may be derived from a second clock signal 436b. In some instances, a duty cycle correction circuit 410 may be used to adjust the duty cycle of the second clock signal 436b and to provide an input to a driver circuit 412 that is configured drive the clock channel 484. In another example, the CDR circuit 448 may generate the sampling clock signal 434 from a third clock signal 436c.

Limiting power consumption presents a major challenge in SERDES-based design. In mobile communication devices, reducing power consumption can increase battery life between charges. The switching frequency of physical layer (PHY) circuits in communication interfaces can be a major factor in power consumption of an apparatus. Accordingly, power consumption is a parameter that must be considered when the PHY circuits are designed to meet ever-increasing demands for data rates and corresponding signaling rates associated with the communication interface. Demands for higher data rates and increased performance from SERDES-based PHY circuits are a consequence of continual advances in process technology and changing industry and proprietary standards. Moreover, PHY circuits are typically required to maintain backward compatibility to all previous generations of technology while supporting the higher data rates required by ever-evolving standards, necessitating increased numbers of transistors. Clock generation circuits for SERDES-based PHY circuits are frequently determinative of maximum data rates for an application and power consumption increases with frequency. Increasing the complexity of clock generation circuits can further increase power consumption of the PHY circuits.

In conventional SERDES-based PHY circuits, clock and data recovery (CDR) circuits typically include a phase interpolator (PI) that requires precise quadrature clock generation to produce the 4 phases of a clock signal used by the PI. In some examples, a phase interpolator selects a phase for an output signal by mixing two phase versions of an input signal. The phase of the output signal is selected by weighting the contributions of the two phase versions of an input signal in the output signal. For example, the phase versions of the input signal may be quadrature (I and Q) signals that are separated by a 90° phase shift and the output signal may be generated with a phase shift that can be changed in step intervals. The output signal may have substantially the same phase as the Q signal when the I input signal is weighted at 0% and the Q input signal is weighted at 100%. The phase of the output signal may be modified by stepwise adding and/or removing weight to the inputs. The use of multiple phase-shifted higher frequency clock signals by a SERDES is associated with significant power consumption including power consumption by the phase interpolator.

Certain aspects of this disclosure relate to clock generation circuits that can support a wide range of data rates while maintaining low design complexity and low power consumption. In one example, a clock generation circuit disclosed herein can operate at low power while delivering high quality clock signals to a transceiver (TX/RX) circuit. A clock generation circuit provided in accordance with certain aspects of this disclosure may use clock signals provided by a PLL and can operate at low power over a wide range of data rates and can be adapted to support process scaling. A clock generation circuit provided in accordance with certain aspects of this disclosure can generate robust clock signals with precise phase relationships. A clock generation circuit provided in accordance with certain aspects of this disclosure can be used with a variety of SERDES architectures, and can support multiple data rates required by certain SERDES-based PHY applications.

According to certain aspects of this disclosure, clock generation in a SERDES-based PHY can be partitioned between a high-frequency clock generation path and a lower-frequency clock generation path, of which one clock generation path is active at any time. In some implementations, a fixed frequency source clock signal may be used by both clock generation paths. In some implementations, the frequency of the source clock signal may be varied.

Figure 5:
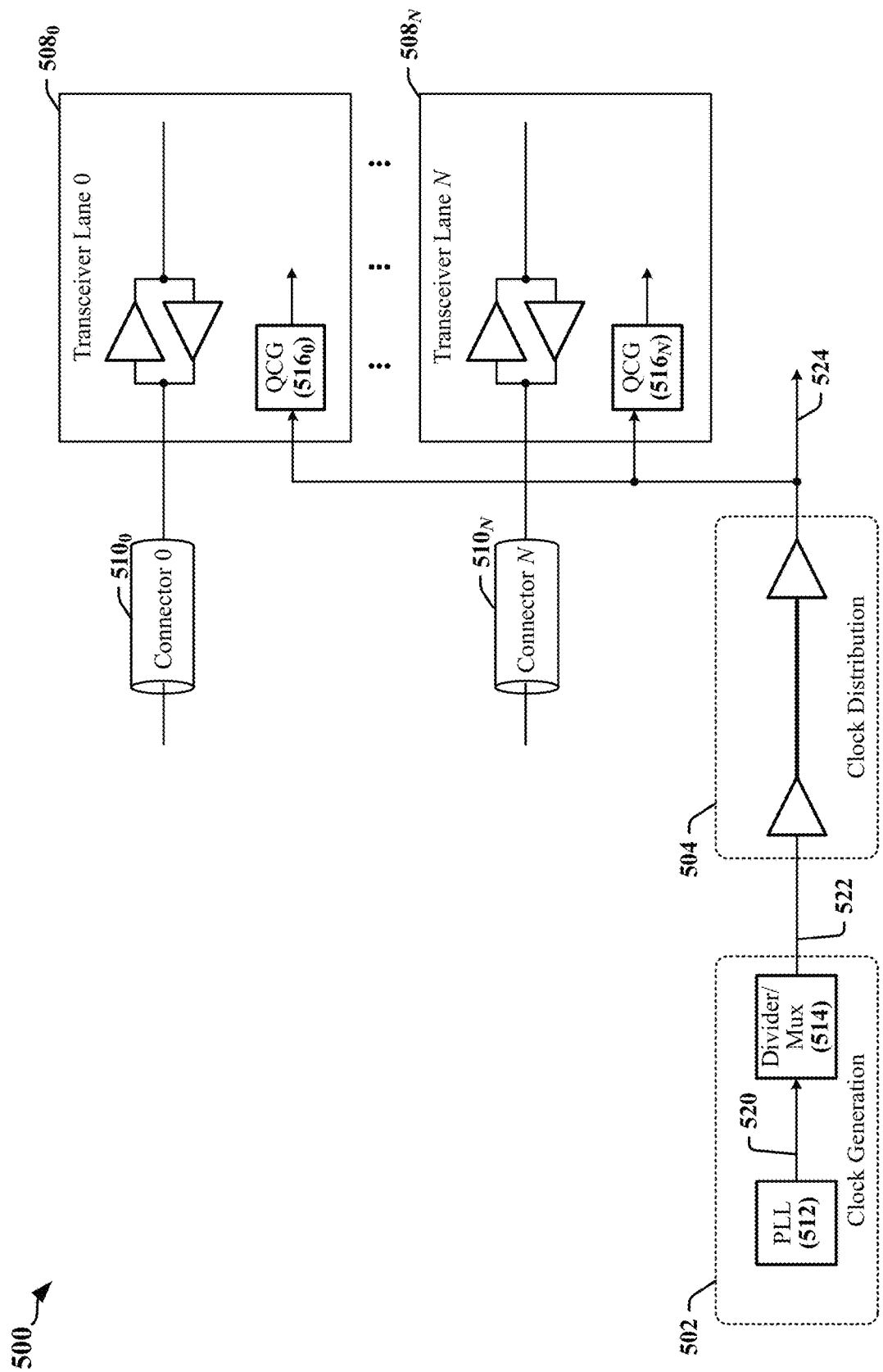
FIG. 5 illustrates clock distribution in a multi-lane communication interface.

FIG. 5 is a conceptual drawing 500 that illustrates clock distribution in an example of a PHY in a multi-lane communication interface. In the illustrated example, each lane of the communication interface is provided using a connector 5100-510N, interconnect or wire. A set of transceivers 5080-508N is coupled to a corresponding connector 5100-510N and each transceiver 5080-508N may receive a fixed-frequency clock signal 524 that can be used to generate multiphase clock signals that control transmission of data bits over the corresponding connector 5100-510N and/or that control sampling or capturing of data in signal received over the corresponding connector 5100-510N.

In the illustrated example, a clock generation or recovery circuit 502 includes a phase locked loop circuit (the PLL 512) that can be configured to generate a source clock signal 520 at a predefined or desired frequency. The output clock signal 522 produced by the clock generation or recovery circuit 502 may be derived from the source clock signal 520, and may have the same frequency as the source clock signal 520. In some instances, the output clock signal 522 has a different frequency than the source clock signal 520. For example, the source clock signal 520 may be provided to a divider and/or multiplexer circuit 514 that can be used to select between the source clock signal 520 and a lower frequency version of the source clock signal 520. The output clock signal 522 may be buffered for distribution and to provide the fixed-frequency clock signal 524 to the transceivers 508O-508N.

A PLL 512 and associated clock distribution circuits 504 can be simplified and optimized for use at a predefined frequency when the PHY is configured to use a fixed-frequency clock signal 524 in accordance with certain aspects of this disclosure. Each transceiver 508O-508N includes quadrature clock generation circuits 516O-516N that can generate multiple phases for higher-frequency clock and lower-frequency clock paths. In certain implementations, circuits in the high-frequency clock path operate in a half-rate mode, while circuits in the lower-frequency clock path operate in a full-rate mode. In one example, the high-frequency clock path support data rates of 24 Gigabits per second (Gbps) or more while the low-frequency clock path support data rates of 12 Gbps or less. In other examples, the high-frequency clock path may support data rates that are less than 24 Gbps and/or the low-frequency clock path can support data rates that are greater than 12 Gbps. The use of half-rate mode in the high-frequency clock path can permit the PLL 512 and clock distribution circuits 504 to be operated at lower frequencies.

Figure 6:
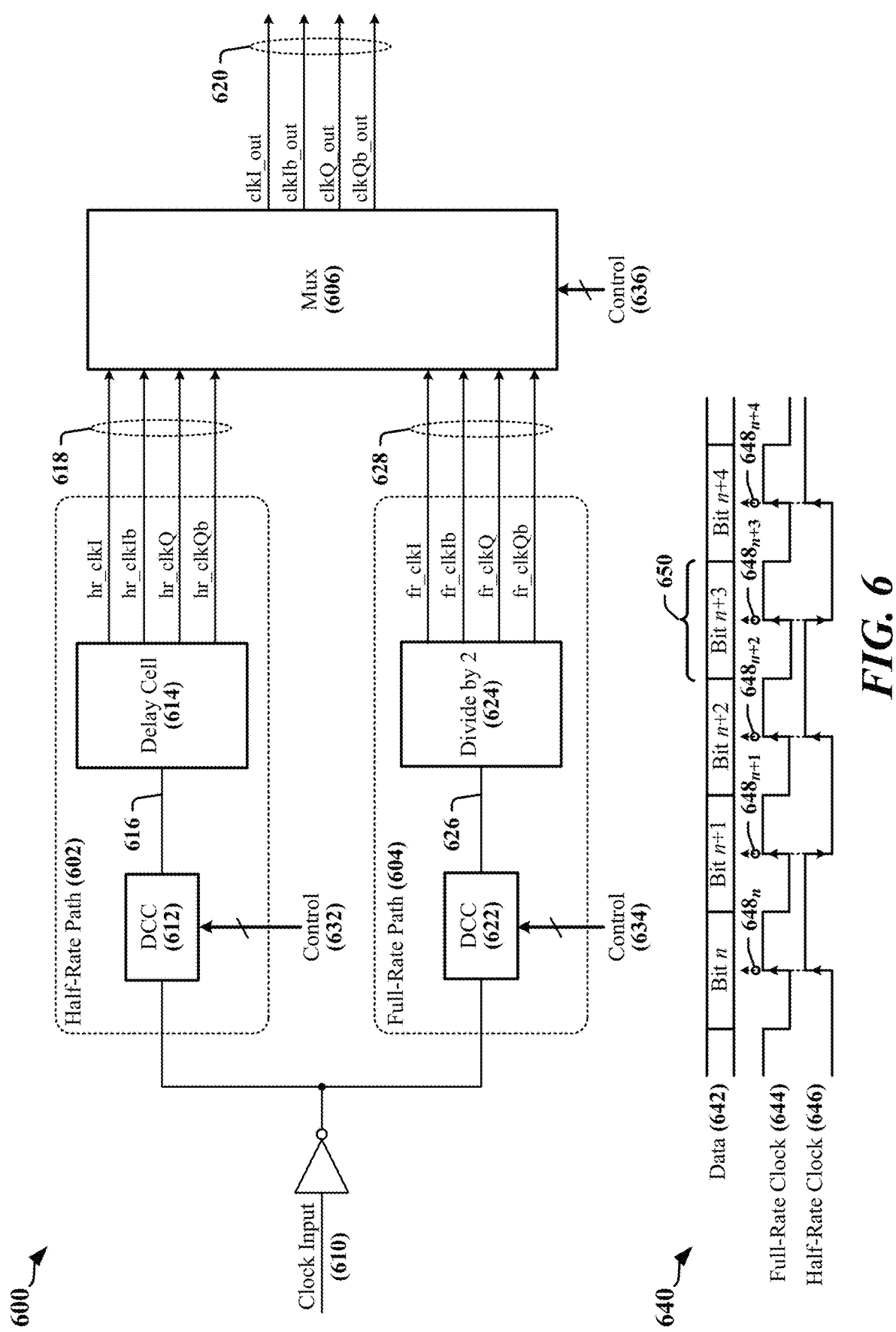
FIG. 6 illustrates a hybrid clock generation circuit configured in accordance with certain aspects of this disclosure.

FIG. 6 illustrates a hybrid clock generation circuit 600 configured in accordance with certain aspects of this disclosure. In one example, the hybrid clock generation circuit 600 is provided in a transceiver of a multi-lane communication interface. The hybrid clock generation circuit 600 provides a half-rate path 602 that may be used for higher data rate communication and a full-rate path 604 that may be used for lower data rate communication. In one example, the half-rate path 602 may be configured to support data rates of 24 Gigabits per second (Gbps) or more, while the full-rate path supports data rates of 12 Gbps or less. In other examples, the half-rate path 602 may support data rates that are less than 24 Gbps and/or the full-rate path 604 supports data rates that are greater than 12 Gbps. A common input clock signal 610 is distributed to the half-rate path 602 and the full-rate path 604.

In the illustrated example, the half-rate path 602 and the full-rate path 604 generate multiphase clock signals that can be used to capture data from a communication channel or to control transmission of data bits over the communication channel. The multiphase clock signals include a differential in-phase clock signal and a differential quadrature clock signal that is phase-shifted by 90° with respect to the differential in-phase clock signal. A differential signal includes two complementary signals that are phase-shifted by 180° with respect to one another.

The half-rate path 602 includes a duty cycle correction circuit (DCC 612) and a delay module 614 configured in accordance with certain aspects of this disclosure. The DCC 612 receives a buffered version of the input clock signal 610 and provides a corrected clock signal 616 to the delay module 614. In some examples, the input clock signal 610 and/or the corrected clock signal 616 may be differential signals. In the illustrated example, the input clock signal 610 and the corrected clock signal 616 are single-ended signals. The delay module 614 may invert the corrected clock signal 616 or otherwise generate an inverted version of the corrected clock signal 616 that is phase-shifted by 180° with respect to the corrected clock signal 616. In some implementations, the delay module 614 includes a first delay cell that is configured to produce an output clock signal that is phase-shifted by 90° with respect to the input clock signal 610 and includes a second delay cell that is configured to produce an output clock signal that is 614 is phase-shifted by 90° with respect to an inverted version of the input clock signal 610.

The term half-rate as used herein refers to the use of a clock signal that is half the frequency of the data signal, and different phases of the half-rate clock signal can be used to capture bits of data from different bit transmission intervals 650. The timing diagram 640 illustrates an example of a full-rate clock signal 644 and a half-rate clock signal 646 that may be used to capture data from a data signal 642. The full-rate clock signal 644 has a period that matches the duration of each bit transmission interval 650 (i.e., the duration of transmission of each of Bit n-Bit n+4), and a data bit can be captured during each cycle of the full-rate clock signal 644. In the illustrated example, the data bits are captured using rising edges of the full-rate clock signal 644, which are timed to occur at the midpoint $648_n$-$648n$+4 of each bit transmission interval 650. In other examples, the falling edges of the full-rate clock signal 644 may be used to capture data bits. In some implementations, data bits are captured near the end of each bit transmission interval 650.

The half-rate clock signal 646 has a period that corresponds to twice the duration of each bit transmission interval 650, and a data bit must be captured during each half-cycle of the half-rate clock signal 646. That is, data bits are captured using both rising edges and falling edges of the half-rate clock signal 646, which are timed to occur at the midpoint $648_n$-$648n$+4 of each bit transmission interval 650 in the illustrated example. In other examples, data bits are captured near the end of each bit transmission interval 650.

The output 618 of the half-rate path 602 includes multiple phase versions of the input clock signal 610, including a differential in-phase version of the input clock signal (hr_clkI and hr_clkIb) and a differential quadrature version of the input clock signal (hr_clkQ and hr_clkQb), which is phase-shifted by 90° with respect to the differential in-phase version of the input clock signal. Each of the complementary signal pairs (hr_clkI/hr_clkIb and hr_clkQ/hr_clkQb) includes two signals that are phase-shifted by 180° with respect to one another. Therefore, the output 618 of the half-rate path 602 includes four phase versions of the input clock that are spread at nominal 90° intervals (i.e., 0° phase shifted, 90° phase shifted, 180° phase shifted and 270° phase shifted), and that can be used to capture data bits during each half-cycle of the input clock signal 610. The half-rate path 602 can significantly reduce power consumption and clock distribution design complexity in high data rate modes of operation.

Each delay cell in the delay module 614 may employ a delay line structure to produce the output 618 of the half-rate path 602. In one example, each delay cell may be implemented using a delay line structure that has two delay stages. A delay line structure that is limited to 2 delay stages can operate at significantly higher clock frequencies than is possible with delay line structure that use more than 2 delay stages. Minimizing the delay stages in the delay line structure can yield significant power savings, can enable controllable and/or tunable delays to be closely matched, and can reduce susceptibility to the effects of noise in the input clock signal 610.

The full-rate path 604 includes a duty cycle correction circuit (i.e., the DCC circuit 622) and a divider circuit 624 that can be implemented using complementary metal-oxide-semiconductor (CMOS) digital circuits. In one example, the divider circuit 624 can be implemented using one or more flipflops, each triggered by an edge in the input clock signal 610. The DCC circuit 622 receives a buffered version of the input clock signal 610 and provides a corrected clock signal 626 to the divider circuit 624. In the illustrated example, the input clock signal 610 and the corrected clock signal 616 are single-ended signals. In other examples, the input clock signal 610 and/or the corrected clock signal 616 may be differential signals.

The divider circuit 624 may be implemented using a simple CMOS divide-by-2 divider to generate an output 628 with four phases for use in full-rate modes of operation that provide lower data rates. The divider circuit 624 can be constructed using robust simple circuits that operate with low power and are tolerant of process, voltage or temperature (PVT) variations. For example, a divider circuit 624 based on CMOS circuitry can be easily scaled as process technology advances.

The output 628 of the full-rate path 604 includes multiple phase versions of the input clock signal 610, including a differential in-phase version of the input clock signal (fr_clkI and fr_clkIb) and a differential quadrature version of the input clock signal (fr_clkQ and fr_clkQb), which is phase-shifted by 90° with respect to the differential in-phase version of the input clock signal. Each of the complementary signal pairs (fr_clkI/fr_clkIb and fr_clkQ/fr_clkQb) includes two signals that are phase-shifted by 180° with respect to one another. Therefore, the output 628 of the full-rate path 604 nominally includes four phase versions of the divided input clock, the versions being spread at nominal 90° intervals that can be used to capture data bits during each cycle of the input clock signal 610. That is, when the input clock signal 610 has a frequency of 2x Hz, the output 628 of the full-rate path 604 includes four signals with a frequency of x Hz, including signals with a 0° phase shift, a 90° phase shift, a 180° phase shift and a 270° phase shift. In one example, the input clock signal 610 has a frequency of 12 GHZ and the output 628 of the full-rate path 604 includes four signals with a frequency of 6 GHZ.

The hybrid clocking scheme disclosed herein may be employed in communication links that employ short-reach and clock forwarding SERDES architectures. Certain aspects are applicable to inter-chiplet communication, LPDDR SDRAM interfaces, in addition to data communication links used to couple functional elements within an apparatus according to proprietary or standards-defined protocols.

In one aspect of this disclosure, power savings can be accrued by disabling the full-rate path 604 when the output 618 of the half-rate path 602 is used to control capture of data bits, and by disabling the half-rate path 602 when the output 628 of the full-rate path 604 is used to control capture of data bits. The half-rate path 602 may be disabled by blocking or decoupling the input clock signal 610 from one or more circuits of the half-rate path 602. In one example, a control input 632 provided to the DCC 612 in the half-rate path 602 may be configured to block the input clock signal 610. The control input 632 may also provide configuration or feedback settings used to correct duty cycle when the half-rate path 602 is active. The control input 632 may be provided by a processor or controller in the PHY or by a processing circuit that is configured to control communication through the PHY.

The full-rate path 604 may be disabled by blocking or decoupling the input clock signal 610 from one or more circuits of the full-rate path 604. In one example, a control input 634 provided to the DCC circuit 622 in the full-rate path 604 may be configured to block the input clock signal 610. The control input 634 may also provide configuration or feedback settings used to correct duty cycle when the full-rate path 604 is active. The control input 634 may be provided by a processor or controller in the PHY or by a processing circuit that is configured to control communication through the PHY.

A multiplexer 606 may be used to select between the output 618 of the half-rate path 602 and the output 628 of the full-rate path 604 to provide the multiphase output 620 of the hybrid clock generation circuit 600. The multiplexer may select the multiphase output 620 of the hybrid clock generation circuit 600 based on the configuration of a control input 636. The control input 636 may be provided by a processor or controller in the PHY or by a processing circuit that is configured to control communication through the PHY.

Figure 7:
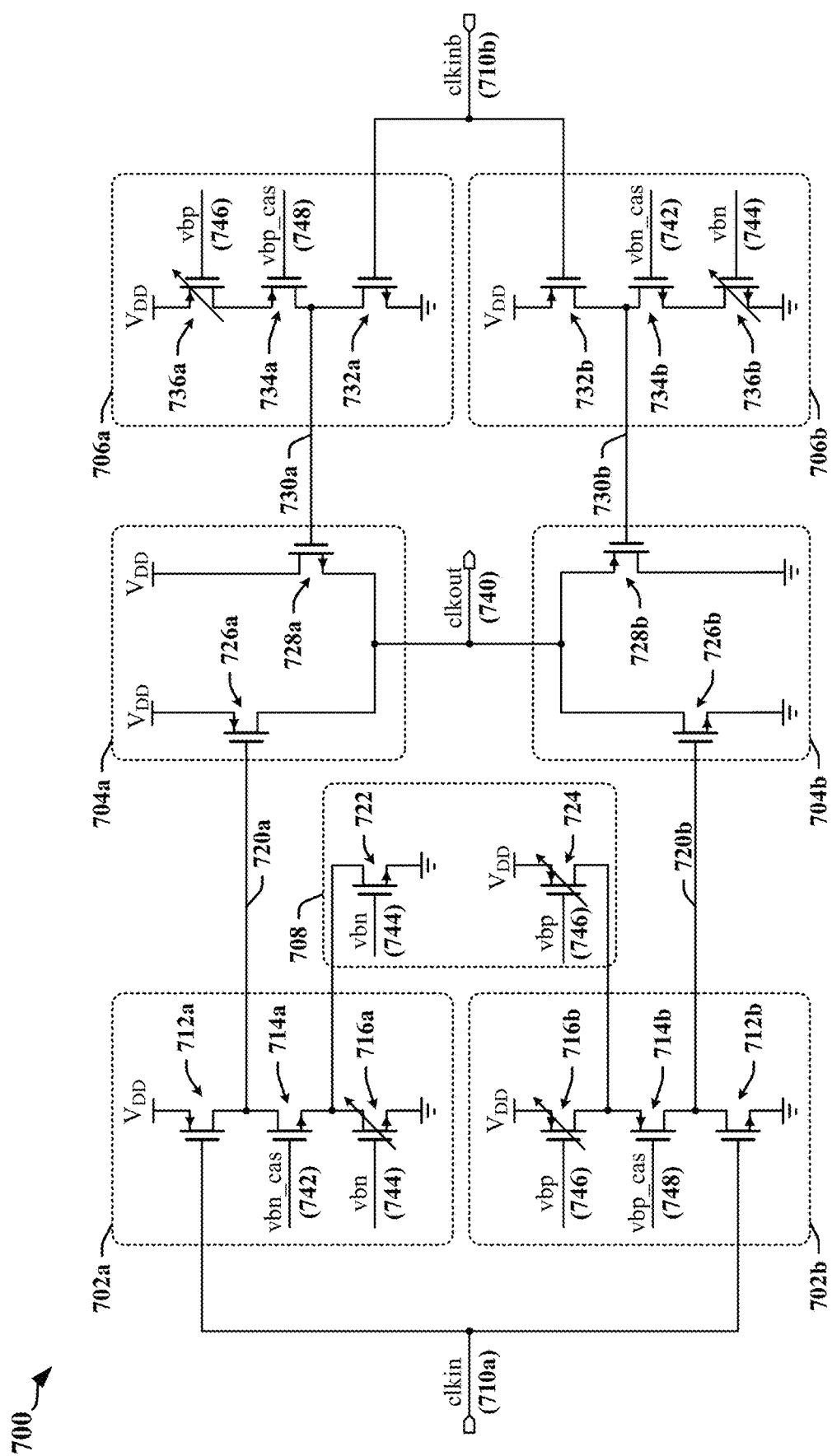
FIG. 7 illustrates an example of a delay cell provided in accordance with certain aspects of this disclosure.

FIG. 7 illustrates an example of a delay cell 700 provided in accordance with certain aspects of this disclosure. In one example, the delay cell 700 may be used in the delay module 614 in the half-rate path 602 illustrated in FIG. 6. The illustrated delay cell 700 includes a main delay generation section 810 (see FIGS. 8 and 9), a compensation section 1010 (see FIGS. 10 and 11) and, in some implementations, a duty cycle correction circuit (the DCC circuit 708). In some respects, the main delay generation section 810 is configured as a push-pull amplifier that receives an input clock signal 710a and drives an output clock signal 740.

A first input circuit 702a in the main delay generation section 810 includes an input PMOS transistor 712a coupled in series with two NMOS transistors 714a, 716a between the rails of a power supply (VDD and ground in FIGS. 7-11). The input PMOS transistor 712a has a source coupled to VDD and a gate that is coupled to the input clock signal 710a. The drain of the input PMOS transistor 712a provides the output 720a of the first input circuit 702a. Furthermore, the drain of input PMOS transistor 712a is coupled to ground through two series coupled NMOS transistors 714a and 716a, of which at least NMOS transistor 716a is tunable. The gates of the NMOS transistors 714a and 716a receive respective bias voltages 742 and 744 that can be configured to control the amplitude of current flowing from the source of NMOS transistor 714a to ground through NMOS transistor 716a. In one example, NMOS transistor 716a may be constructed using multiple NMOS transistors that can be coupled in parallel. A tuning code may control switches that select or activate a quantity of NMOS transistors or individual NMOS transistors to be coupled in parallel. The bias voltage 744 is coupled to the base of at least the selected or activated NMOS transistors. In another example, NMOS transistor 716a may be tuned using an analog control signal. NMOS transistor 716a may be used to tune the amplitude of current flowing from the source of NMOS transistor 714a to ground.

The bias voltages 742 and 744 provided to the gates of NMOS transistors 714a and 716a, respectively, may be generated using a bandgap reference current (Ie). The bias voltages 742 and 744 control the level of current that flows through NMOS transistors 714a and 716a to ground, and the NMOS transistors 714a and 716a may be characterized as a current source or as an Ie current source. The level of current flowing through the NMOS transistors 714a and 716a can be controlled, calibrated or tuned to adjust the rate at which edges rise in the output clock signal 740. The level of current flowing through the NMOS transistors 714a and 716a may be used to tune the delay between the input clock signal 710a and the output clock signal 740.

The output 720a of the first input circuit 702a is coupled to an input of a first output driver circuit 704a. In the illustrated example, a first PMOS output transistor 726a has a gate that is coupled to the drain of the input PMOS transistor 712a, a source that is coupled to VDD, and a drain that is configured to drive the output clock signal 740. The output clock signal 740 is also coupled to an output of the compensation section 1010, as will be discussed below.

A second input circuit 702b in the main delay generation section 810 includes an input NMOS transistor 712b coupled in series with two PMOS transistors 714b, 716b between the rails of the power supply. The input NMOS transistor 712b has a source coupled to ground and a gate that is coupled to the input clock signal 710a. The drain of the input NMOS transistor 712b provides the output 720a of the second input circuit 702b. The drain of input NMOS transistor 712b is also coupled to VDD through two series-coupled PMOS transistors 714b and 716b, of which at least PMOS transistor 716b is tunable. The gates of the PMOS transistors 714b and 716b receive respective bias voltages 746 and 748 that can be configured to control the amplitude of current flowing from the source of PMOS transistors 714b to ground through PMOS transistor 716b. In one example, PMOS transistor 716b may be constructed using multiple PMOS transistors that can be coupled in parallel. A tuning code may control switches that select or activate a quantity of PMOS transistors or individual PMOS transistors to be coupled in parallel. The bias voltage 746 is coupled to the base of at least the selected or activated PMOS transistors. In another example, PMOS transistor 716b may be tuned using an analog control signal. PMOS transistor 716b may be used to tune the amplitude of current flowing from the source of PMOS transistor 714b to ground.

The bias voltages 746 and 748 provided to the gates of PMOS transistors 714b and 716b, respectively, may be generated using a bandgap reference current (Ie). The bias voltages 746 and 748 control the level of current that flows through PMOS transistors 714b and 716b to ground, and the PMOS transistors 714b and 716b may be characterized as a current source or as an Ie current source. The level of current flowing through the PMOS transistors 714b and 716b can be controlled, calibrated or tuned to adjust the rate at which edges fall in the output clock signal 740. The level of current flowing through the PMOS transistors 714b and 716b may be used to tune the delay between the input clock signal 710a and the output clock signal 740.

The output 720b of the second input circuit 702b is coupled to an input of a second output driver circuit 704b. In the illustrated example, a first NMOS output transistor 726b has a gate that is coupled to the drain of the input NMOS transistor 712b, a source that is coupled to ground, and a drain that is configured to drive the output clock signal 740. The output clock signal 740 is driven by the first input circuit 702a and second input circuit 702b in a push-pull manner with contributions from the compensation section 1010.

The compensation section 1010 includes a first tracking circuit 706a and a second tracking circuit 706b which receive a complementary version of input clock signal 710a, which is referred to herein as the complementary input clock signal 710b. The tracking circuits 706a, 706b may be configured to compensate for PVT variations. Each of the tracking circuits 706a, 706b includes a current source that is substantially similar to a current source provided in a corresponding input circuit 702a, 702b. The first tracking circuit 706a can be configured such that its current source tracks the corresponding current source in the second input circuit 702b. In the illustrated example, the current source in the first tracking circuit 706a includes PMOS transistors 734a, 736a that are arranged, configured and controlled in a substantially similar manner to the PMOS transistors 714b, 716b that provide the current source in the second input circuit 702b. The second tracking circuit 706b can be configured such that its current source tracks the corresponding current source in the first input circuit 702a. In the illustrated example, the current source in the second tracking circuit 706b includes NMOS transistors 734b, 736b that are arranged, configured and controlled in a substantially similar manner to the NMOS transistors 714a, 716a that provide the current source in the first input circuit 702a.

The first tracking circuit 706a may be further configured to respond to edges in the complementary input clock signal 710b in order to provide cross-skew compensation to rising edges in the output clock signal 740. The second tracking circuit 706b may be further configured to respond to edges in the complementary input clock signal 710b in order to provide cross-skew compensation to falling edges in the output clock signal 740.

The first tracking circuit 706a includes an input NMOS transistor 732a coupled in series with two PMOS transistors 734a, 736a between the rails of a power supply (VDD and ground in FIG. 7). The input NMOS transistor 732a has a source coupled to ground and a gate that is coupled to the complementary input clock signal 710b. The drain of the input NMOS transistor 732a provides the output 730a of the first tracking circuit 706a. The drain of input NMOS transistor 732a is coupled to VDD through two series coupled PMOS transistors 734a and 736a, of which at least PMOS transistor 736a is tunable. The gates of the PMOS transistors 734a and 736a receive respective bias voltages 746 and 748 that can be configured to control the amplitude of current flowing from VDD to the source of PMOS transistor 734a through PMOS transistor 736a. In one example, PMOS transistor 736a may be constructed using multiple PMOS transistors that can be coupled in parallel. A tuning code may control switches that select or activate a quantity of PMOS transistors or individual PMOS transistors to be coupled in parallel. The bias voltage 746 is coupled to the base of at least the selected or activated PMOS transistors. In another example, PMOS transistor 736a may be tuned using an analog control signal. PMOS transistor 736a may be used to tune the amplitude of current flowing from the source of PMOS transistor 734a to ground.

The bias voltages 746 and 748 provided to the gates of PMOS transistors 734a and 736a, respectively, may be generated using a bandgap reference current (Ie). The bias voltages 746 and 748 control the level of current that flows through PMOS transistors 734a and 736a to ground, and the PMOS transistors 734a and 736a may be characterized as a current source or an Ie current source. The level of current flowing through the PMOS transistors 734a and 736a can be controlled, calibrated or tuned to adjust rising edges in the output clock signal 740. The level of current flowing through the PMOS transistors 734a and 736a may be used to tune the delay between the complementary input clock signal 710b and the output clock signal 740.

The output 730a of the first tracking circuit 706a is coupled to an input of the first output driver circuit 704a. In the illustrated example, a second NMOS output transistor 728a has a gate that is coupled to the drain of the input NMOS transistor 732a, a drain that is coupled to VDD, and a source that is coupled to the output clock signal 740.

The second tracking circuit 706b includes an input PMOS transistor 732b coupled in series with two NMOS transistors 734b, 736b between the rails of a power supply (VDD and ground in FIG. 7). The input PMOS transistor 732b has a source coupled to VDD and a gate that is coupled to the complementary input clock signal 710b. The drain of the input PMOS transistor 732b provides the output 730ba of the second tracking circuit 706b. The drain of input PMOS transistor 732b is coupled to ground through two series coupled NMOS transistors 734b and 736b, of which at least NMOS transistor 736b is tunable. The gates of the NMOS transistors 734b and 736b receive respective bias voltages 742 and 744 that can be configured to control the amplitude of current flowing from the source of NMOS transistor 734b to ground through NMOS transistor 736b. In one example, NMOS transistor 736b may be constructed using multiple NMOS transistors that can be coupled in parallel. A tuning code may control switches that select or activate a quantity of NMOS transistors or individual NMOS transistors to be coupled in parallel. The bias voltage 744 is coupled to the base of at least the selected or activated NMOS transistors. In another example, NMOS transistor 736b may be tuned using an analog control signal. NMOS transistor 736b may be used to tune the amplitude of current flowing from the source of NMOS transistor 734b to ground.

The bias voltages 742 and 744 provided to the gates of NMOS transistors 734b and 736b, respectively, may be generated using a bandgap reference current (Ie). The bias voltages 742 and 744 control the level of current that flows through NMOS transistors 734b and 736b to ground, and the NMOS transistors 734b and 736b may be characterized as a current source or an Ie current source. The level of current flowing through the NMOS transistors 734b and 736b can be controlled, calibrated or tuned to adjust falling edges in the output clock signal 740. The level of current flowing through the NMOS transistors 734b and 736b may be used to tune the delay between the complementary input clock signal 710b and the output clock signal 740.

The output 730b of the second tracking circuit 706b is coupled to an input of the second output driver circuit 704b. In the illustrated example, a second PMOS output transistor 728b has a gate that is coupled to the drain of the input PMOS transistor 732b, a drain that is coupled to ground, and a source that is coupled to the output clock signal 740.

The illustrated delay cell 700 includes a DCC circuit 708 that provides duty cycle correction in addition to the DCC circuit 622 provided in the hybrid clock generation circuit 600 illustrated in FIG. 6. In the illustrated delay cell 700, the transition times of rising and/or falling edges in a clock signal are modified to obtain a desired delay duration. The duty cycle of the clock signal may be changed when rising edges and falling edges have different transition times after the delay cell 700 has been calibrated or configured. While the external DCC circuit 622 may be used in some implementations to compensate for duty cycle distortion within the delay cell 700, race conditions can occur because calibration of the DCC circuit 622 and calibration of the delay cell 700 are performed independently of one another, and the calibration processes can counteract each other without producing a desired configuration of both the DCC circuit 622 and the delay cell 700. The use of the internal DCC circuit 708 can correct duty cycle distortions introduced by the configuration of the delay cell 700 without modifying the configuration of the external DCC circuit 622.

The illustrated DCC circuit 708 includes an NMOS transistor 722 and a tunable PMOS transistor 724. In other examples, the NMOS transistor 722 may be tunable in addition or as an alternative to the tunable PMOS transistor 724. The NMOS transistor 722 has a source coupled to ground and a gate that is configured to receive the bias voltage 744. The drain of NMOS transistor 722 is coupled to the source of NMOS transistor 714a in the first input circuit 702a. The PMOS transistor 724 has a source coupled to VDD and a drain that is coupled to the source of PMOS transistor 714b in the second input circuit 702b. The gate of PMOS transistor 724 receives the bias voltage 746 and may be configured to control the amplitude of current flowing from VDD through PMOS transistor 724. In one example, PMOS transistor 724 may be constructed using multiple PMOS transistors that can be coupled in parallel. A tuning code may control switches that select or activate a quantity of PMOS transistors or individual PMOS transistors to be coupled in parallel. The bias voltage 746 is coupled to the base of at least the selected or activated PMOS transistors. In another example, PMOS transistor 724 may be tuned using an analog control signal.

The currents provided to the input circuits 702a and 702b by the DCC circuit 708 can be configured to tune or further adjust the transition times of edges in the input clock signal 710a by the input circuits 702a and 702b in order to correct or offset duty cycle distortions generated within the delay cell 700. In certain implementations, the timing of rising edges in the output clock signal 740 can be tuned at the first input circuit 702a using the current flowing through NMOS transistor 722 and the timing of falling edges in the output clock signal 740 can be tuned at the first input circuit 702a using the current flowing through PMOS transistor 724. In the illustrated example, the timing of falling edges in the output clock signal 740 may be tuned by varying current flow through the PMOS transistor 724 while the current flowing through NMOS transistor 722 remains constant. In other examples, the timing of falling edges in the output clock signal 740 may be tuned by varying the current flowing through NMOS transistor 722 while the current flowing through PMOS transistor 724 remains constant.

Figure 8:
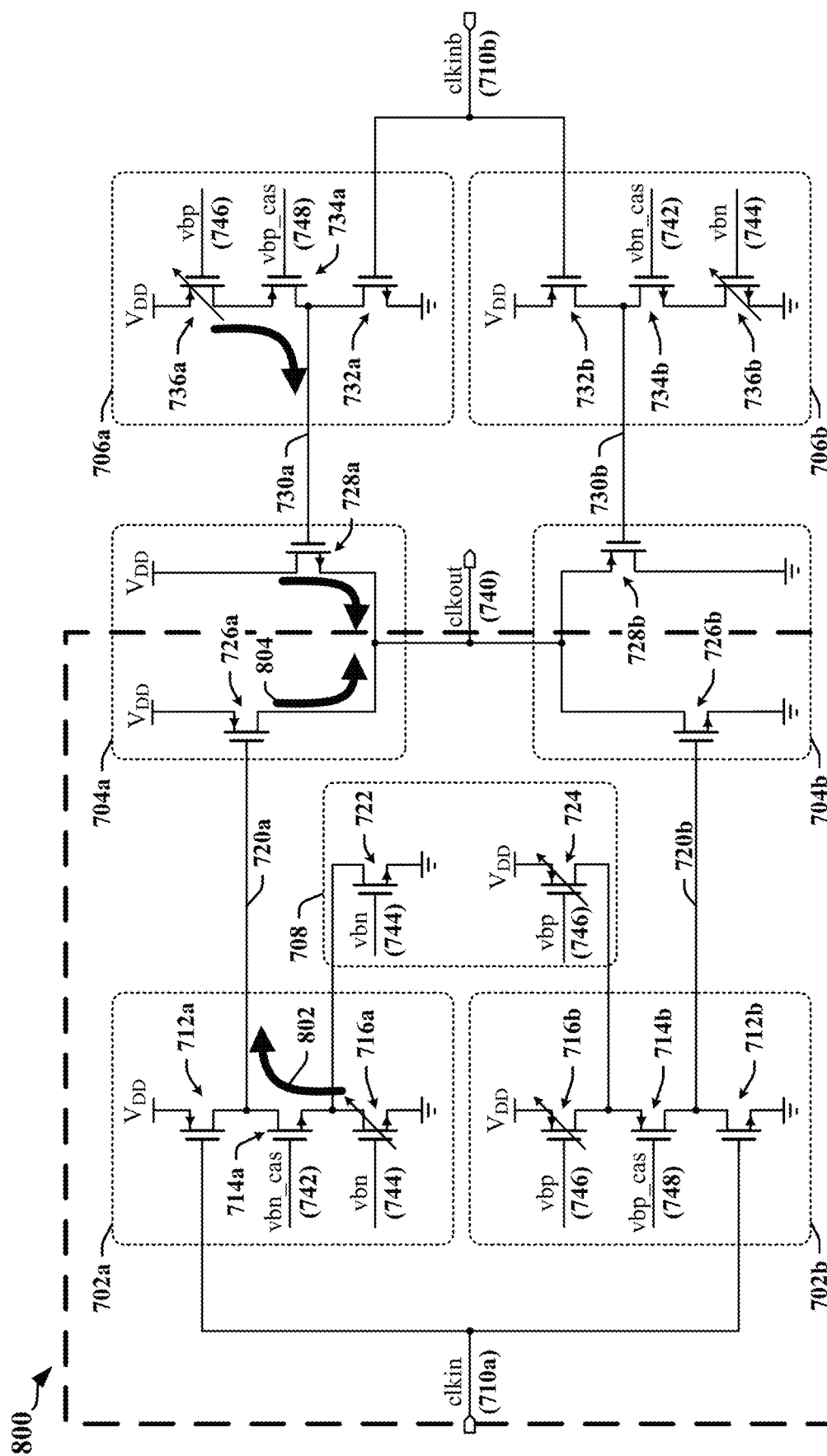
FIGS. 8-11 illustrate certain aspects of the response to edges in the input clock signal by a delay cell provided in accordance with certain aspects of this disclosure.

FIG. 8 illustrates certain aspects of the response 800 of the main delay generation section 810 to a rising edge in the input clock signal 710a. A transition to a high voltage level on the input clock signal 710a deactivates, disables or turns off the input PMOS transistor 712a causing the voltage at the output 720a of the first input circuit 702a to be pulled to a low voltage level through the operation 802 of the NMOS transistors 714a, 716a. For the purposes of this description, the low voltage level may be substantially equal to the ground voltage level and the high voltage level may approach VDD and, in any case, is greater that the low voltage level. The low voltage level of the output 720a of the first input circuit 702a causes the first PMOS output transistor 726a in the first output driver circuit 704a to be activated, enabled or turned on. The first PMOS output transistor 726a causes 804 the output clock signal 740 to transition to the high voltage level when activated, enabled or turned on. The second output driver circuit 704b is deactivated, disabled or turned off when the input clock signal 710a transitions to the high voltage level.

Figure 9:
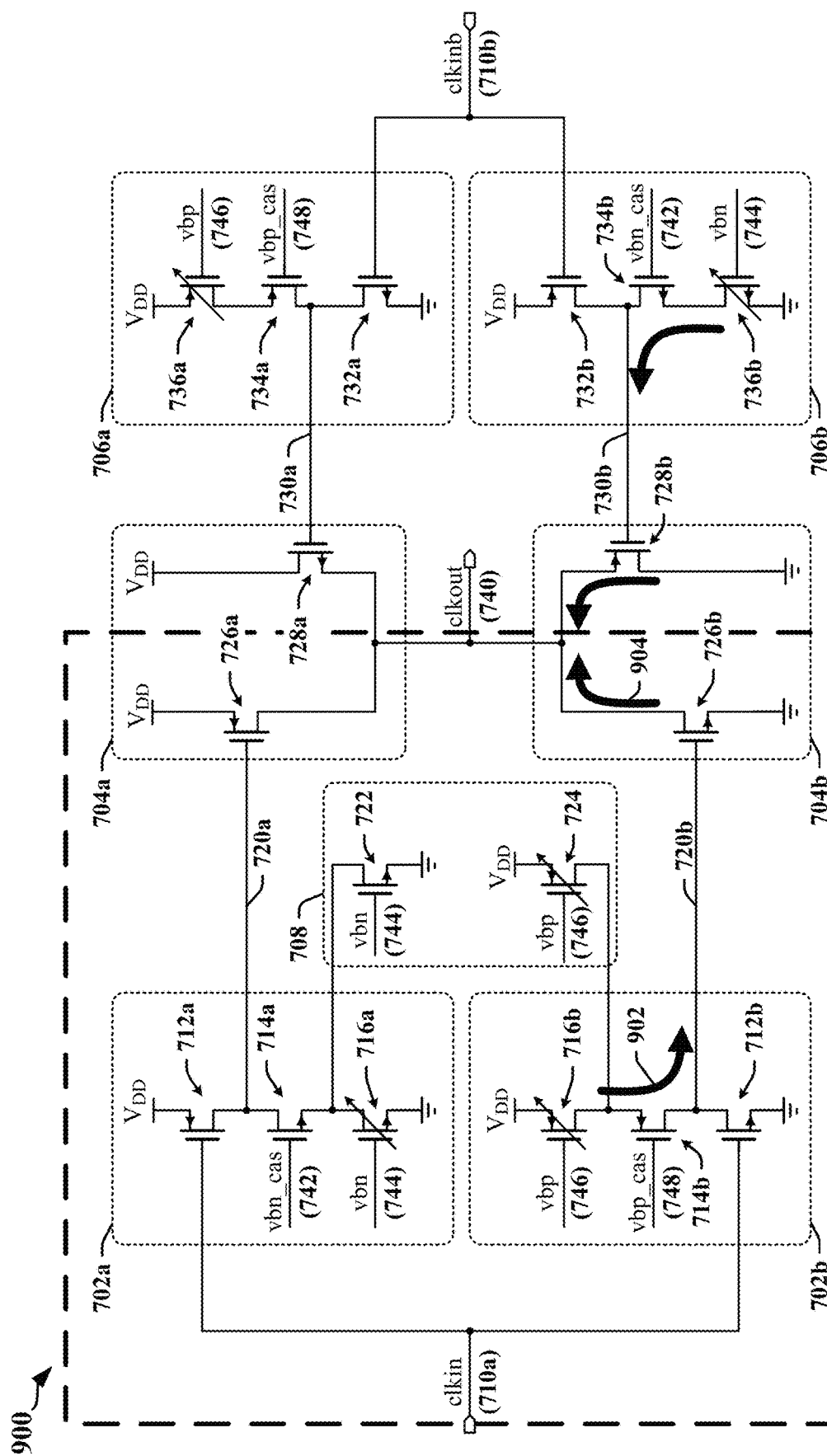

FIG. 9 illustrates certain aspects of the response 900 of the main delay generation section 810 to a falling edge in the input clock signal 710a. A transition to a low voltage level on the input clock signal 710a deactivates, disables or turns off the input NMOS transistor 712b causing the voltage at the output 720b of the second input circuit 702b to be pulled to a high voltage level through the operation 902 of the PMOS transistors 714b, 716b. The high voltage level of the output 720b of the second input circuit 702b causes the first NMOS output transistor 726b in the second output driver circuit 704b to be activated, enabled or turned on. The first NMOS output transistor 726*b* causes 904 the output clock signal 740 to transition to the low voltage level when activated, enabled or turned on. The first output driver circuit 704*a* is deactivated, disabled or turned off when the input clock signal 710*a* transitions to the low voltage level.

Figure 10:
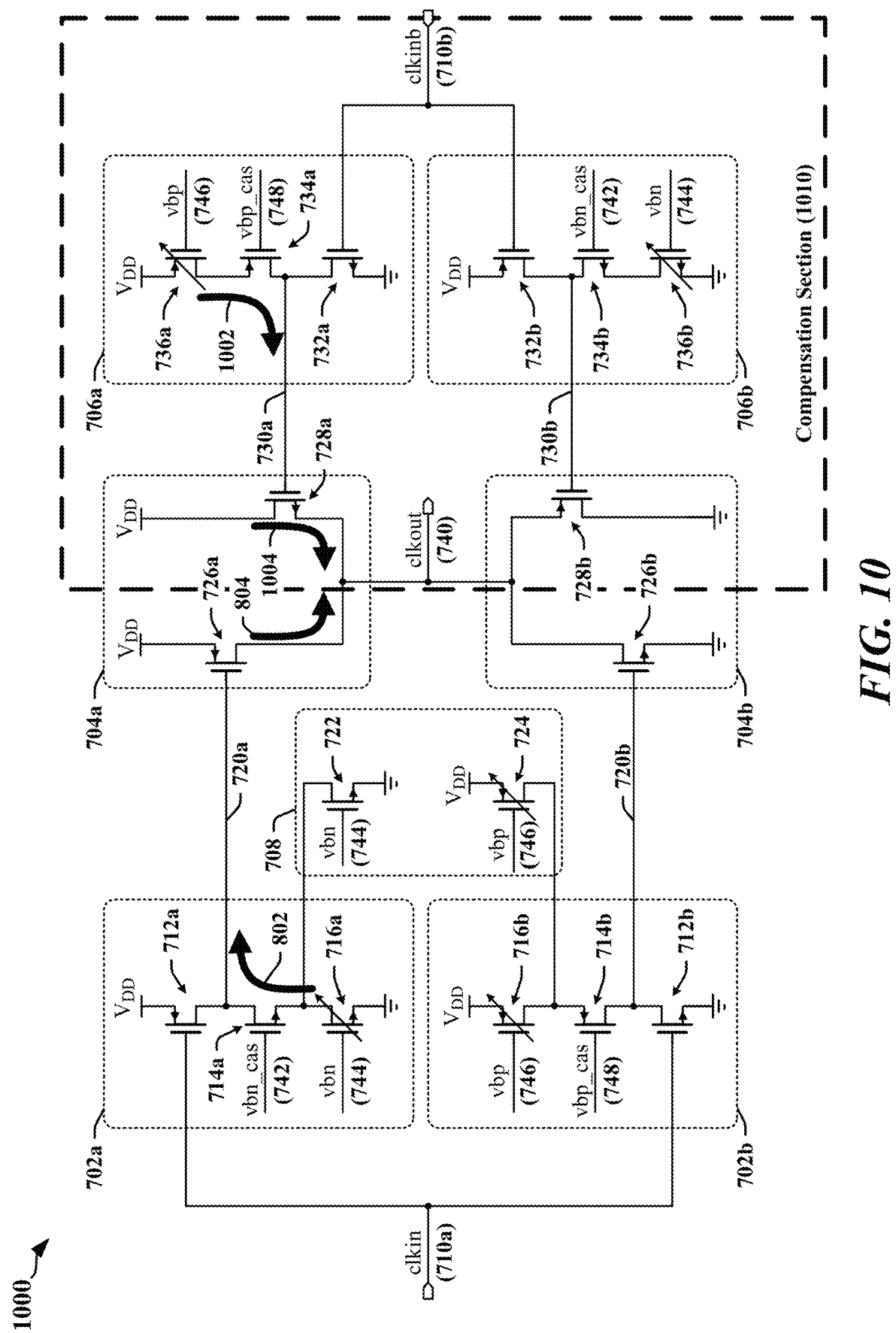

FIG. 10 illustrates certain aspects of the response 1000 of the compensation section 1010 to a rising edge in the input clock signal 710*a*. As discussed in reference to FIG. 9, a transition to a high voltage level on the input clock signal 710*a* deactivates, disables or turns off the input PMOS transistor 712*a* causing the voltage at the output 720*a* of the first input circuit 702*a* to be pulled to a low voltage level through the operation 802 of the NMOS transistors 714*a*, 716*a*. The low voltage level of the output 720*a* of the first input circuit 702*a* causes the first PMOS output transistor 726*a* in the first output driver circuit 704*a* to be activated, enabled or turned on. The first PMOS output transistor 726*a* causes 804 the output clock signal 740 to transition to the high voltage level when activated, enabled or turned on. The second output driver circuit 704*b* is deactivated, disabled or turned off when the input clock signal 710*a* transitions to the high voltage level.

The first tracking circuit 706*a* also drives the output clock signal 740 to the high voltage level when a rising edge is provided in the input clock signal 710*a*. The first tracking circuit 706*a* provides cross-skew corner compensation for the first PMOS output transistor 726*a*. The first tracking circuit 706*a* responds to the complementary input clock signal 710*b*, and a transition to the low voltage level on the complementary input clock signal 710*b* deactivates, disables or turns off the input NMOS transistor 732*a*, causing the voltage at the output 730*a* of the first tracking circuit 706*a* to be pulled to a high voltage level through the operation 1002 of the PMOS transistors 734*a*, 736*a*. The high voltage level of the output 720*a* of the first tracking circuit 706*a* causes the second NMOS output transistor 728*a* in the first output driver circuit 704*a* to be activated, enabled or turned on. The second NMOS output transistor 728*a* further causes 1004 the output clock signal 740 to transition to the high voltage level when activated, enabled or turned on.

Figure 11:
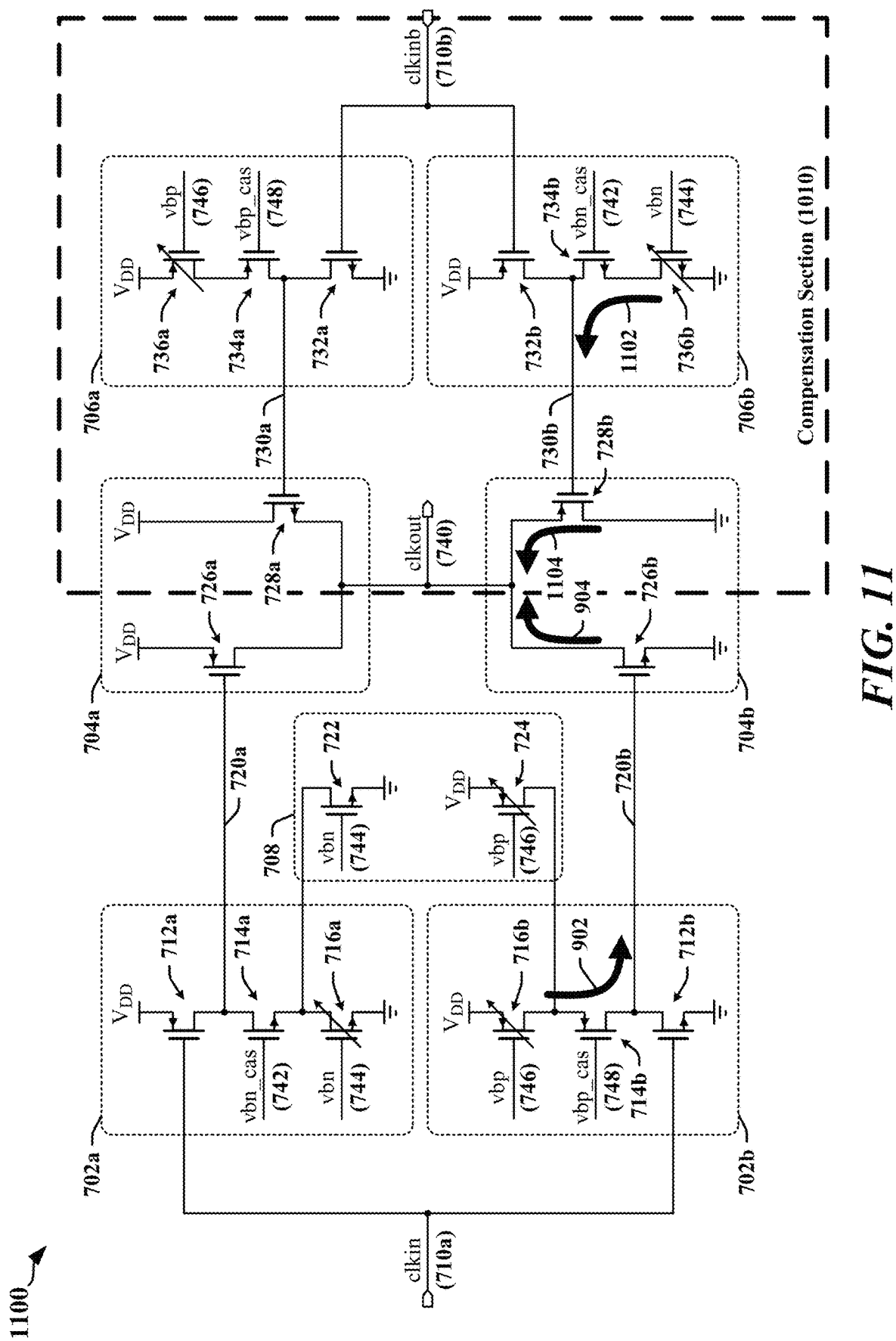

FIG. 11 illustrates certain aspects of the response 1100 of the compensation section 1010 to a falling edge in input clock signal 710*a*. As discussed in reference to FIG. 9, a transition to a low voltage level on the input clock signal 710*a* deactivates, disables or turns off the input NMOS transistor 712*b* causing the voltage at the output 720*b* of the second input circuit 702*b* to be pulled to a high voltage level through the operation 902 of the PMOS transistors 714*b*, 716*b*. The high voltage level of the output 720*b* of the second input circuit 702*b* causes the first NMOS output transistor 726*b* in the second output driver circuit 704*b* to be activated, enabled or turned on. The first NMOS output transistor 726*b* causes 904 the output clock signal 740 to transition to the low voltage level. The first input circuit 702*a* and the first output driver circuit 704*a* are deactivated, disabled or turned off when the input clock signal 710*a* transitions to the low voltage level.

The second tracking circuit 706*b* also drives the output clock signal 740 to the low voltage level when a falling edge is provided in the input clock signal 710*a*. The second tracking circuit 706*b* provides cross-skew corner compensation for the first NMOS output transistor 726*b*. The second tracking circuit 706*b* responds to the complementary input clock signal 710*b*, and a transition to the high voltage level on the complementary input clock signal 710*b* deactivates, disables or turns off the input PMOS transistor 732*b*, causing the voltage at the output 730*b* of second tracking circuit 706*b* to be pulled to a low voltage level through the operation 1102 of the NMOS transistors 734*b*, 736*b*. The low voltage level of the output 720*b* of the second tracking circuit 706*b* causes the second PMOS output transistor 728*b* in the second output driver circuit 704*b* to be activated, enabled or turned on. The second PMOS output transistor 728*b* further causes 1104 the output clock signal 740 to transition to the high voltage level when activated, enabled or turned on.

Figure 12:
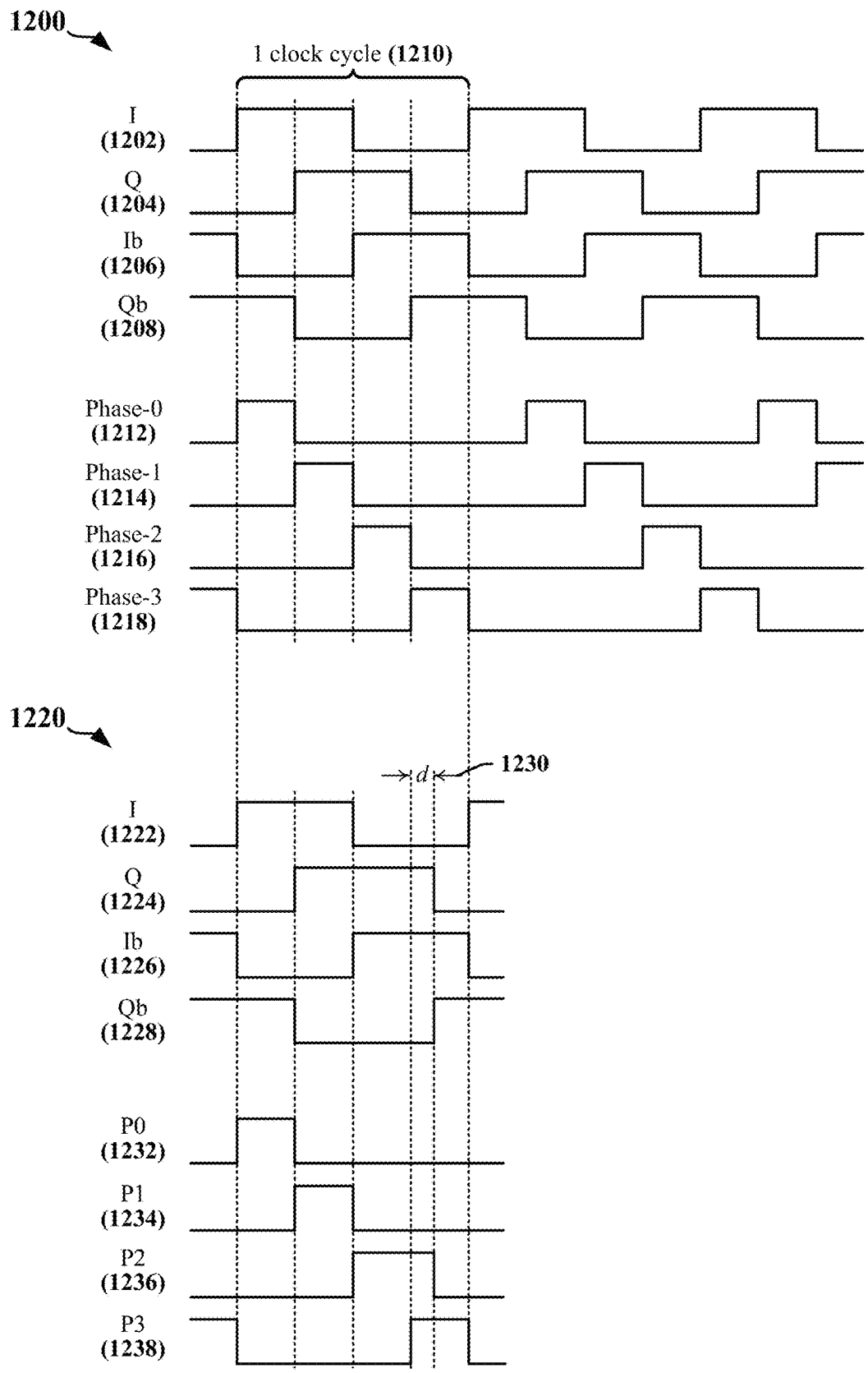
FIG. 12 illustrates examples of clock signaling configured or adapted in accordance with certain aspects of this disclosure.

FIG. 12 illustrates examples of signaling 1200 and 1220 configured or adapted in accordance with certain aspects of this disclosure. The configuration of the clock signals may correspond in certain respects to the configuration of the multiphase signal provided as the multiphase output 620 of the hybrid clock generation circuit 600 illustrated in FIG. 6. The first example corresponds to signaling 1200 obtained when the clock generation circuit is operating with nominal timing. The signaling 1200 include an in-phase version of a clock signal (the I phase 1202), a quadrature version of the clock signal (the Q phase 1204) that is phase-shifted by 90° from the I phase 1202, an inverse version of the I phase 1202 (the Ib phase 1206) that is phase-shifted by 180° from the I phase 1202 and an inverse version of the Q phase 1204 (the Qb phase 1208) that is phase-shifted by 180° from the Q phase 1204. The edges in these phases 1202, 1204, 1206 and 1208 define four portions of each clock cycle 1210, as indicated by the phase state indicators 1212, 1214, 1216, 1218. The durations of the pulses in the phase state indicators 1212, 1214, 1216, 1218 are equal for a nominally operating clock generation circuit.

The second example corresponds to signaling 1220 with a distorted duty cycle. The signaling 1220 has the same frequency as the signaling 1200 illustrated in the first example. The signaling 1220 includes an in-phase version of the clock signal (the I phase 1222), a quadrature version of the clock signal (the Q phase 1224) that is phase-shifted by 90° from the I phase 1222, an inverse version of the I phase 1222 (the Ib phase 1226) that is phase-shifted by 180° from the I phase 1222 and an inverse version of the Q phase 1224 (the Qb phase 1228) that is phase-shifted by 180° from the Q phase 1224. In this example, duty cycle distortion affects the Q phase 1224 and the Qb phase 1228. In some instances, duty cycle distortions affect some other combination of the phases 1222, 1224, 1226 and 1228. In some instances, duty cycle distortions affect all of the phases 1222, 1224, 1226 and 1228. The combination of phases 1222, 1224, 1226 and 1228 affected by duty cycle distortion is based on the source of the distortion. The edges in these phases 1222, 1224, 1226 and 1228 define four portions of each clock cycle 1210, as indicated by the phase state indicators 1232, 1234, 1236, 1238. In the illustrated example, the duration of pulses in one phase state indicator 1236 is different from the durations of pulses in the other phase state indicators 1232, 1234, 1238. The duration of the state indicator 1236 includes an additional delay 1230 that distorts the duty cycle of the Q phase 1224 and the Qb phase 1228.

Referring also to the hybrid clock generation circuit 600 illustrated in FIG. 6 and the delay cell 700 illustrated in FIG. 7, a sequence of calibration or configuration steps may be followed to obtain a multiphase clock signal in which each phase 1202, 1204, 1206, 1208 has a desired frequency and duty cycle. The frequency of the input clock signal 610 may be configured or calibrated as an initial step. The DCC circuit 612 or 622 may then be configured or calibrated to provide a corrected clock signal 616 or 626 with a 50% duty cycle.

One or more calibration steps may be performed for the delay module 614 in the half-rate path 602. In the example of a delay cell 700 illustrated in FIG. 7, the delays provided by the delay cell 700 may be calibrated by configuring the bias voltages 742 and 744. The delays may be tuned by configuring the tunable transistors 716a, 716b, 736a and 736b. Duty cycle distortions may be corrected by calibrating or configuring the DCC circuit 708. In one example, the timing of falling edges in the output clock signal 740 may be tuned by varying current flow through the PMOS transistor 724 while the current flowing through NMOS transistor 722 remains constant. In another example, the timing of falling edges in the output clock signal 740 may be tuned by varying the current flowing through NMOS transistor 722 while the current flowing through PMOS transistor 724 remains constant.

The divider circuit 624 in the full-rate path 604 may require little or no calibration and configuration. In some implementations, the CMOS circuits used to construct the divider circuit 624 can provide a divider that is simple and robust in the presence of PVT variations. A divider circuit 624 constructed from CMOS circuits can be expected to operate at low power may be easily scaled with improvements or changes in process technology.

Figure 13:
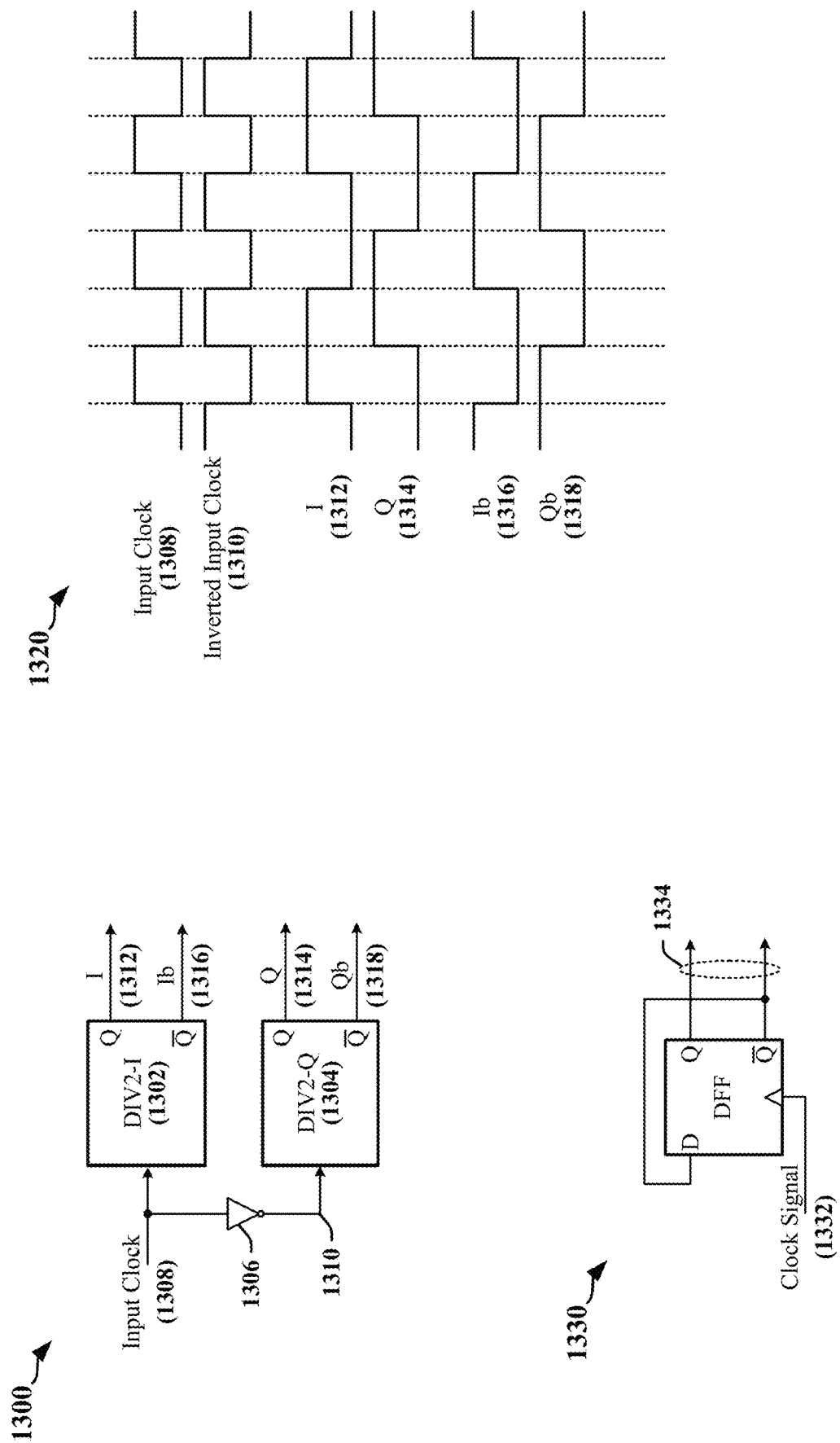
FIG. 13 illustrates an example of a divider circuit provided in accordance with certain aspects of this disclosure.

FIG. 13 illustrates an example of a divider circuit 1300 that may be used in the full-rate path 604 of the hybrid clock generation circuit 600 illustrated in FIG. 6. In the illustrated example, a first divide-by-2 divider 1302 receives an input clock signal 1308 and produces an in-phase output signal (the I phase 1312) and an inverted version of the I phase 1312 (the Ib phase 1316) that is phase-shifted by 180° from the I phase 1312. The input clock signal 1308 is provided to an inverter 1306 that provides an inverted input clock signal 1310 to a second divide-by-2 divider 1304. The second divide-by-2 divider 1304 produces a quadrature version of the output signal (the Q phase 1314) that is phase-shifted by 90° from the I phase 1312, and an inverted version of the Q phase 1314 (the Qb phase 1318) that is phase-shifted by 180° from the Q phase 1204.

The timing diagram 1320 illustrates the expected relationships between the input clock signal 1308, the inverted input clock signal 1310, the I phase 1312, the Q phase 1314, the Ib phase 1316 and the Qb phase 1318. In one example, the input clock signal 1308 has a frequency of 12 GHZ, and produces an output clock in four phases 1312, 1314, 1316 and 1318 at a frequency of 6 GHZ.

FIG. 13 also illustrates one example in which each of the divide-by-2 dividers 1302, 1304 may be implemented using a D-Flipflop (the DFF 1330). The example of a D-Flipflop is provided solely to facilitate this description, and other types of divider circuit, flipflops, registers or set-reset circuits may be combined or employed to construct the divider circuit 624 in the full-rate path 604 illustrated in FIG. 6. The illustrated DFF 1330 may be triggered by a rising edge or falling edge in a clock signal 1332 and is configured to toggle its output 1334 when triggered.

Figure 14:
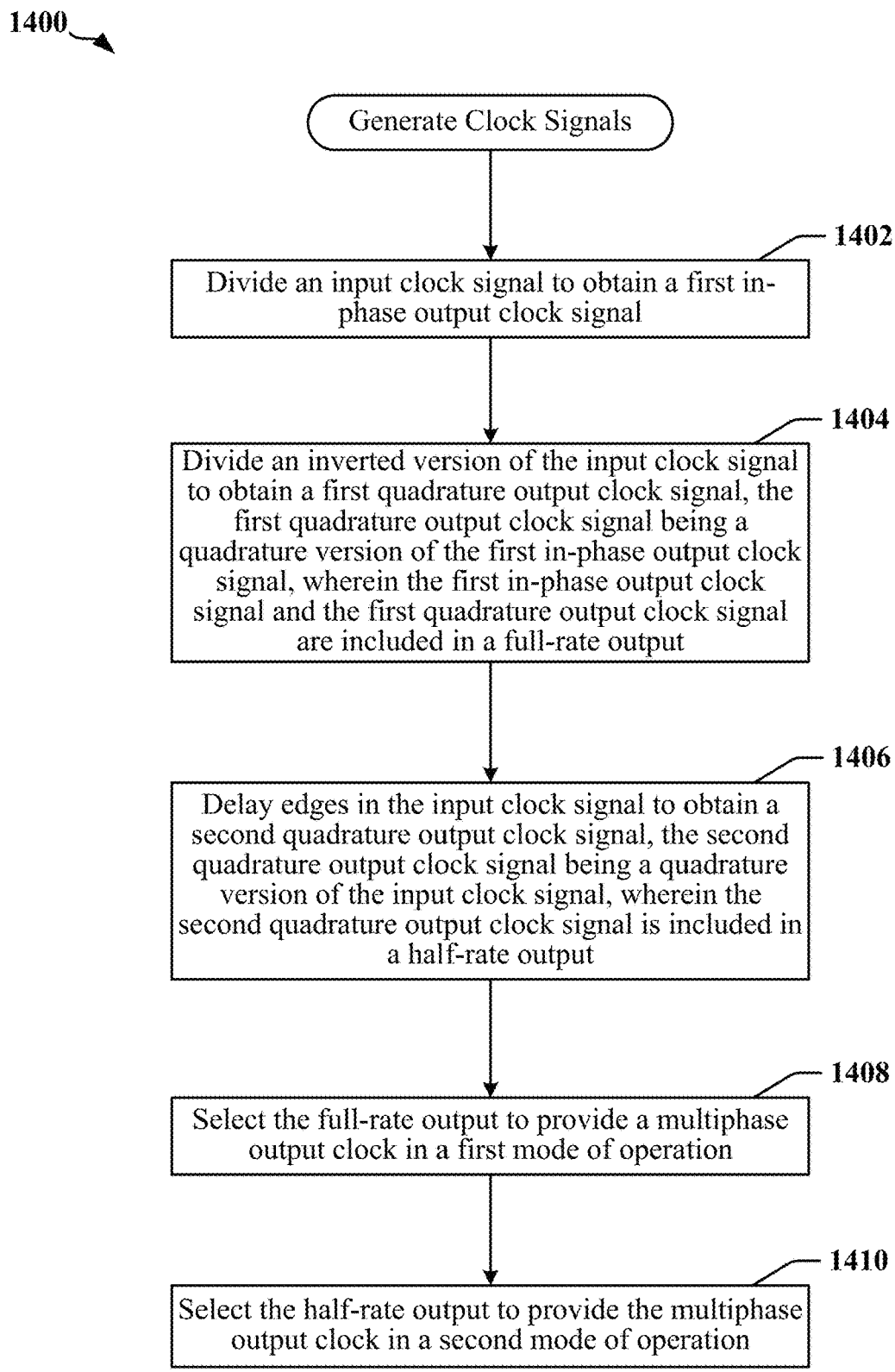
FIG. 14 is a flowchart of a method for generating clock signals in accordance with certain aspects of this disclosure.

FIG. 14 is a flowchart 1400 of a method for generating clock signals in accordance with certain aspects of this disclosure. The method may be performed using a clock generation circuit such as the hybrid clock generation circuit 600 illustrated in FIG. 6. In some instances, the method may be implemented or involve using one or more processors or controllers. At block 1402 in the illustrated method, an input clock signal may be divided to obtain a first in-phase output clock signal. At block 1404 in the illustrated method, an inverted version of the input clock signal may be divided to obtain a first quadrature output clock signal. The first quadrature output clock signal may be a quadrature version of the first in-phase output clock signal. The first in-phase output clock signal and the first quadrature output clock signal may be included in a full-rate output. The full-rate output may include one or more multiphase signals.

At block 1406 in the illustrated method, edges in the input clock signal may be delayed to obtain a second quadrature output clock signal. The second quadrature output clock signal being a quadrature version of the input clock signal. The quadrature output clock signal may be included in a half-rate output. The half-rate output may include one or more multiphase signals. In one example, an inverted version of the second quadrature output clock signal is included in the half-rate output.

At block 1408 in the illustrated method, a multiplexer may select the full-rate output to provide the multiphase output clock in a first mode of operation. At block 1410 in the illustrated method, the multiplexer may select the half-rate output to provide the multiphase output clock in a second mode of operation. In some instances, an inverted version of the first in-phase output clock signal and an inverted version of the first quadrature output clock signal are included in the full-rate output.

In some implementations, a second in-phase output clock signal may be provided in the half-rate output. The second in-phase output clock signal may include an in-phase version of the input clock signal. In some of these implementations, an inverted version of the second in-phase output clock signal may be included in the half-rate output. A first tracking circuit may be used to provide cross-skew compensation to rising edges in the second in-phase output clock signal. The structure and operation of the first tracking circuit may correspond in some respects to the structure and operation of the first tracking circuit 706a in the delay cell 700 illustrated in FIGS. 7-11. A second tracking circuit may be used to provide cross-skew compensation to falling edges in the second in-phase output clock signal. The structure and operation of the second tracking circuit may correspond in some respects to the structure and operation of the second tracking circuit 706b in the delay cell 700 illustrated in FIGS. 7-11.

In some examples, a first duty cycle correction circuit is used to decouple the input clock signal from a delay circuit that is configured to provide the second quadrature output clock signal in the first mode of operation. A second duty cycle correction circuit may be used to correct duty cycle distortions caused by the delay cell. In some examples, a third duty cycle correction circuit is used to decouple the input clock signal from one or more divider circuits that are configured to generate the first in-phase output clock signal or the first quadrature output clock signal in the first mode of operation.

The method illustrated in FIG. 11 may be executed in or using an IC device. In one example, the IC device comprises an SoC. In another example, the IC device is included in one of multiple semiconductor dice mounted on a substrate. The IC device may be implemented as a chiplet in some instances.

The IC device may include a bus interface. The bus interface may include a hybrid clock generation circuit that has a divider circuit as part of a full-rate path for clock distribution, a delay cell as part of a half-rate path for clock distribution, and a multiplexer that can be commanded or controlled to select between the full-rate path and the half-rate path. The divider circuit includes a first divider and a second divider. The first divider may be coupled to an input clock signal. The first divider may be configured to provide a first in-phase output clock signal in a full-rate output. The first in-phase output clock signal may have a frequency that is half the frequency of the input clock signal. The second divider may be coupled to an inverted version of the input clock signal. The second divider may be configured to provide a first quadrature output clock signal in the full-rate output. The first quadrature output clock signal may be a quadrature version of the first in-phase output clock signal. The delay cell can be configured to delay edges in the input clock signal and to provide a half-rate output. The half-rate output includes a second quadrature output clock signal that is a quadrature version of the input clock signal. The multiplexer may be configured to select the full-rate output to provide a multiphase output clock when the hybrid clock generation circuit is configured for a first mode of operation. The multiplexer may be configured to select the half-rate output to provide the multiphase output clock when the hybrid clock generation circuit is configured for a second mode of operation.

In some implementations, the first divider is further configured to provide an inverted version of the first in-phase output clock signal in the full-rate output. The second divider may be further configured to provide an inverted version of the first quadrature output clock signal in the full-rate output.

In certain implementations, the delay cell is configured to provide a second in-phase output clock signal in the half-rate output. The second in-phase output clock signal may be an in-phase version of the input clock signal. The delay cell may be configured to provide an inverted version of the second in-phase output clock signal in the half-rate output. The delay cell may include a compensation section. In the compensation section, a first tracking circuit may be configured to provide cross-skew compensation to rising edges in the second in-phase output clock signal, and a second tracking circuit may be configured to provide cross-skew compensation to falling edges in the second in-phase output clock signal.

In some implementations, the delay cell is configured to provide an inverted version of the second quadrature output clock signal in the half-rate output. The delay cell may be configured to receive the input clock signal through a first duty cycle correction circuit. The first duty cycle correction circuit may be configured to decouple the delay cell from the input clock signal when the hybrid clock generation circuit is configured for the first mode of operation. The delay cell may have a second duty cycle correction circuit configured to correct duty cycle distortions caused by the delay cell.

The first divider and the second divider may be configured to receive the input clock signal through a third duty cycle correction circuit. The third duty cycle correction circuit may be configured to decouple the first divider and the second divider from the input clock signal when the hybrid clock generation circuit is configured for the second mode of operation.

Some implementation examples are described in the following numbered clauses:

1. A hybrid clock generation circuit, comprising: a divider circuit that comprises: a first divider coupled to an input clock signal and configured to provide a first in-phase output clock signal in a full-rate output, the first in-phase output clock signal having a frequency that is half the frequency of the input clock signal; and a second divider coupled to an inverted version of the input clock signal and configured to provide a first quadrature output clock signal in the full-rate output, the first quadrature output clock signal being a quadrature version of the first in-phase output clock signal; a delay cell configured to delay edges in the input clock signal and to provide a half-rate output comprising a second quadrature output clock signal that is a quadrature version of the input clock signal; and a multiplexer configured to: select the full-rate output to provide a multiphase output clock when the hybrid clock generation circuit is configured for a first mode of operation; and select the half-rate output to provide the multiphase output clock when the hybrid clock generation circuit is configured for a second mode of operation.

2. The hybrid clock generation circuit as described in clause 1, wherein the first divider is further configured to provide an inverted version of the first in-phase output clock signal in the full-rate output, and wherein the second divider is further configured to provide an inverted version of the first quadrature output clock signal in the full-rate output.

3. The hybrid clock generation circuit as described in clause 1 or clause 2, wherein the delay cell is configured to provide a second in-phase output clock signal in the half-rate output, the second in-phase output clock signal being an in-phase version of the input clock signal.

4. The hybrid clock generation circuit as described in clause 3, wherein the delay cell is configured to provide an inverted version of the second in-phase output clock signal in the half-rate output.

5. The hybrid clock generation circuit as described in clause 3 or clause 4, wherein the delay cell comprises: a first tracking circuit that is configured to provide cross-skew compensation to rising edges in the second in-phase output clock signal; and a second tracking circuit that is configured to provide cross-skew compensation to falling edges in the second in-phase output clock signal.

6. The hybrid clock generation circuit as described in any of clauses 1-5, wherein the delay cell is configured to provide an inverted version of the second quadrature output clock signal in the half-rate output.

7. The hybrid clock generation circuit as described in any of clauses 1-6, wherein the delay cell is configured to receive the input clock signal through a first duty cycle correction circuit, wherein the first duty cycle correction circuit is configured to decouple the delay cell from the input clock signal when the hybrid clock generation circuit is configured for the first mode of operation.

8. The hybrid clock generation circuit as described in any of clauses 1-7, wherein the delay cell comprises: a second duty cycle correction circuit configured to correct duty cycle distortions caused by the delay cell.

9. The hybrid clock generation circuit as described in any of clauses 1-8, wherein the first divider and the second divider are configured to receive the input clock signal through a third duty cycle correction circuit, wherein the third duty cycle correction circuit is configured to decouple the first divider and the second divider from the input clock signal when the hybrid clock generation circuit is configured for the second mode of operation.

10. A method for generating clock signals, comprising: dividing an input clock signal to obtain a first in-phase output clock signal; dividing an inverted version of the input clock signal to obtain a first quadrature output clock signal, the first quadrature output clock signal being a quadrature version of the first in-phase output clock signal, wherein the first in-phase output clock signal and the first quadrature output clock signal are included in a full-rate output; delaying edges in the input clock signal to obtain a second quadrature output clock signal, the second quadrature output clock signal being a quadrature version of the input clock signal, wherein the second quadrature output clock signal is included in a half-rate output; and selecting the full-rate output to provide a multiphase output clock in a first mode of operation; and selecting the half-rate output to provide the multiphase output clock in a second mode of operation.

11. The method as described in clause 10, further comprising: providing an inverted version of the first in-phase output clock signal in the full-rate output; and providing an inverted version of the first quadrature output clock signal in the full-rate output.

12. The method as described in clause 10 or clause 11, further comprising: providing a second in-phase output clock signal in the half-rate output, the second in-phase output clock signal being an in-phase version of the input clock signal.

13. The method as described in clause 12, further comprising: providing an inverted version of the second in-phase output clock signal in the half-rate output.

14. The method as described in clause 12 or clause 13, further comprising: using a first tracking circuit to provide cross-skew compensation to rising edges in the second in-phase output clock signal; and using a second tracking circuit to provide cross-skew compensation to falling edges in the second in-phase output clock signal.

15. The method as described in any of clauses 10-14, further comprising: providing an inverted version of the second quadrature output clock signal in the half-rate output.

16. The method as described in any of clauses 10-15, further comprising: using a first duty cycle correction circuit to decouple the input clock signal from a delay circuit that is configured to provide the second quadrature output clock signal in the first mode of operation.

17. The method as described in any of clauses 10-16, further comprising: using a delay cell to delay the edges in the input clock signal; and using a second duty cycle correction circuit to correct duty cycle distortions caused by the delay cell.

18. The method as described in any of clauses 10-17, further comprising: using a third duty cycle correction circuit to decouple the input clock signal from one or more divider circuits that are configured to generate the first in-phase output clock signal or the first quadrature output clock signal in the first mode of operation.

19. An apparatus, comprising: means for dividing an input clock signal, including a first divider that is configured to provide a first in-phase output clock signal in a full-rate output, the first in-phase output clock signal having a frequency that is half the frequency of the input clock signal, and a second divider that is configured to provide a first quadrature output clock signal in the full-rate output, the first quadrature output clock signal being a quadrature version of the first in-phase output clock signal; means for delaying edges in the input clock signal, including a delay cell that is configured to provide a second quadrature output clock signal in a half-rate output, the second quadrature output clock signal being a quadrature version of the input clock signal; and means for providing a multiphase output clock, including a multiplexer that is configured to select the full-rate output to provide the multiphase output clock in a first mode of operation, and select the half-rate output to provide the multiphase output clock in a second mode of operation.

20. The apparatus as described in clause 19, wherein the first divider is further configured to provide an inverted version of the first in-phase output clock signal in the full-rate output, and wherein the second divider is further configured to provide an inverted version of the first quadrature output clock signal in the full-rate output.

21. The apparatus as described in clause 19 or clause 20, wherein the delay cell is configured to provide a second in-phase output clock signal in the half-rate output, the second in-phase output clock signal being an in-phase version of the input clock signal.

22. The apparatus as described in clause 21, wherein the delay cell is configured to provide an inverted version of the second in-phase output clock signal in the half-rate output.

23. The apparatus as described in clause 21 or clause 22, wherein the delay cell comprises: a first tracking circuit configured to provide cross-skew compensation to rising edges in the second in-phase output clock signal; and a second tracking circuit configured to provide cross-skew compensation to falling edges in the second in-phase output clock signal.

24. The apparatus as described in any of clauses 19-23, wherein the delay cell is configured to provide an inverted version of the second quadrature output clock signal in the half-rate output.

25. The apparatus as described in any of clauses 19-24, wherein the delay cell is configured to receive the input clock signal through a first duty cycle correction circuit, wherein the first duty cycle correction circuit is configured to decouple the delay cell from the input clock signal in the first mode of operation.

26. The apparatus as described in any of clauses 19-25, wherein the delay cell comprises: a second duty cycle correction circuit configured to correct duty cycle distortions caused by the delay cell.

27. The apparatus as described in any of clauses 19-26, wherein the delay cell comprises: a third duty cycle correction circuit configured to decouple the input clock signal from one or more divider circuits that are configured to generate the first in-phase output clock signal or the first quadrature output clock signal in the first mode of operation.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A hybrid clock generation circuit, comprising:
a divider circuit that comprises:
a first divider coupled to an input clock signal and configured to provide a first in-phase output clock signal in a full-rate output, the first in-phase output clock signal having a frequency that is half the frequency of the input clock signal; and
a second divider coupled to an inverted version of the input clock signal and configured to provide a first quadrature output clock signal in the full-rate output, the first quadrature output clock signal being a quadrature version of the first in-phase output clock signal;
a delay cell configured to delay edges in the input clock signal and to provide a half-rate output comprising a second quadrature output clock signal that is a quadrature version of the input clock signal; and
a multiplexer configured to:
select the full-rate output to provide a multiphase output clock when the hybrid clock generation circuit is configured for a first mode of operation; and
select the half-rate output to provide the multiphase output clock when the hybrid clock generation circuit is configured for a second mode of operation.

2. The hybrid clock generation circuit of claim 1, wherein the first divider is further configured to provide an inverted version of the first in-phase output clock signal in the full-rate output, and wherein the second divider is further configured to provide an inverted version of the first quadrature output clock signal in the full-rate output.

3. The hybrid clock generation circuit of claim 1, wherein the delay cell is configured to provide a second in-phase output clock signal in the half-rate output, the second in-phase output clock signal being an in-phase version of the input clock signal.

4. The hybrid clock generation circuit of claim 3, wherein the delay cell is configured to provide an inverted version of the second in-phase output clock signal in the half-rate output.

5. The hybrid clock generation circuit of claim 3, wherein the delay cell comprises:
a first tracking circuit that is configured to provide cross-skew compensation to rising edges in the second in-phase output clock signal; and
a second tracking circuit that is configured to provide cross-skew compensation to falling edges in the second in-phase output clock signal.

6. The hybrid clock generation circuit of claim 1, wherein the delay cell is configured to provide an inverted version of the second quadrature output clock signal in the half-rate output.

7. The hybrid clock generation circuit of claim 1, wherein the delay cell is configured to receive the input clock signal through a first duty cycle correction circuit, wherein the first duty cycle correction circuit is configured to decouple the delay cell from the input clock signal when the hybrid clock generation circuit is configured for the first mode of operation.

8. The hybrid clock generation circuit of claim 1, wherein the delay cell comprises:
a second duty cycle correction circuit configured to correct duty cycle distortions caused by the delay cell.

9. The hybrid clock generation circuit of claim 1, wherein the first divider and the second divider are configured to receive the input clock signal through a third duty cycle correction circuit, wherein the third duty cycle correction circuit is configured to decouple the first divider and the second divider from the input clock signal when the hybrid clock generation circuit is configured for the second mode of operation.

10. A method for generating clock signals, comprising:
dividing an input clock signal to obtain a first in-phase output clock signal;
dividing an inverted version of the input clock signal to obtain a first quadrature output clock signal, the first quadrature output clock signal being a quadrature version of the first in-phase output clock signal, wherein the first in-phase output clock signal and the first quadrature output clock signal are included in a full-rate output;
delaying edges in the input clock signal to obtain a second quadrature output clock signal, the second quadrature output clock signal being a quadrature version of the input clock signal, wherein the second quadrature output clock signal is included in a half-rate output;
selecting the full-rate output to provide a multiphase output clock in a first mode of operation; and
selecting the half-rate output to provide the multiphase output clock in a second mode of operation.

11. The method of claim 10, further comprising:
providing an inverted version of the first in-phase output clock signal in the full-rate output; and
providing an inverted version of the first quadrature output clock signal in the full-rate output.

12. The method of claim 10, further comprising:
providing a second in-phase output clock signal in the half-rate output, the second in-phase output clock signal being an in-phase version of the input clock signal.

13. The method of claim 12, further comprising:
providing an inverted version of the second in-phase output clock signal in the half-rate output.

14. The method of claim 12, further comprising:
using a first tracking circuit to provide cross-skew compensation to rising edges in the second in-phase output clock signal; and
using a second tracking circuit to provide cross-skew compensation to falling edges in the second in-phase output clock signal.

15. The method of claim 10, further comprising:
providing an inverted version of the second quadrature output clock signal in the half-rate output.

16. The method of claim 10, further comprising:
using a first duty cycle correction circuit to decouple the input clock signal from a delay circuit that is configured to provide the second quadrature output clock signal in the first mode of operation.

17. The method of claim 10, further comprising:
using a delay cell to delay the edges in the input clock signal; and
using a second duty cycle correction circuit to correct duty cycle distortions caused by the delay cell.

18. The method of claim 10, further comprising:
using a third duty cycle correction circuit to decouple the input clock signal from one or more divider circuits that are configured to generate the first in-phase output clock signal or the first quadrature output clock signal in the first mode of operation.

19. An apparatus, comprising:
means for dividing an input clock signal, including a first divider that is configured to provide a first in-phase output clock signal in a full-rate output, the first in-phase output clock signal having a frequency that is half the frequency of the input clock signal, and a second divider that is configured to provide a first quadrature output clock signal in the full-rate output, the first quadrature output clock signal being a quadrature version of the first in-phase output clock signal;

means for delaying edges in the input clock signal, including a delay cell that is configured to provide a second quadrature output clock signal in a half-rate output, the second quadrature output clock signal being a quadrature version of the input clock signal; and means for providing a multiphase output clock, including a multiplexer that is configured to select the full-rate output to provide the multiphase output clock in a first mode of operation, and select the half-rate output to provide the multiphase output clock in a second mode of operation.

20. The apparatus of claim 19, wherein the first divider is further configured to provide an inverted version of the first in-phase output clock signal in the full-rate output, and wherein the second divider is further configured to provide an inverted version of the first quadrature output clock signal in the full-rate output.

21. The apparatus of claim 19, wherein the delay cell is configured to provide a second in-phase output clock signal in the half-rate output, the second in-phase output clock signal being an in-phase version of the input clock signal.

22. The apparatus of claim 21, wherein the delay cell is configured to provide an inverted version of the second in-phase output clock signal in the half-rate output.

23. The apparatus of claim 21, wherein the delay cell comprises:
a first tracking circuit configured to provide cross-skew compensation to rising edges in the second in-phase output clock signal; and
a second tracking circuit configured to provide cross-skew compensation to falling edges in the second in-phase output clock signal.

24. The apparatus of claim 19, wherein the delay cell is configured to provide an inverted version of the second quadrature output clock signal in the half-rate output.

25. The apparatus of claim 19, wherein the delay cell is configured to receive the input clock signal through a first duty cycle correction circuit, wherein the first duty cycle correction circuit is configured to decouple the delay cell from the input clock signal in the first mode of operation.

26. The apparatus of claim 19, wherein the delay cell comprises:
a second duty cycle correction circuit configured to correct duty cycle distortions caused by the delay cell.

27. The apparatus of claim 19, wherein the delay cell comprises:
a third duty cycle correction circuit configured to decouple the input clock signal from one or more divider circuits that are configured to generate the first in-phase output clock signal or the first quadrature output clock signal in the first mode of operation.

* * * * *